United States Patent
Lin et al.

(10) Patent No.: US 11,978,814 B2
(45) Date of Patent: May 7, 2024

(54) SUPERLATTICE PHOTO DETECTOR

(71) Applicant: TEXAS INSTRUMENTS INCORPORATED, Dallas, TX (US)

(72) Inventors: He Lin, Frisco, TX (US); Sameer Pendharkar, Allen, TX (US)

(73) Assignee: Texas Instruments Incorporated, Dallas, TX (US)

( * ) Notice: Subject to any disclaimer, the term of this patent is extended or adjusted under 35 U.S.C. 154(b) by 131 days.

(21) Appl. No.: 17/474,492

(22) Filed: Sep. 14, 2021

(65) Prior Publication Data

US 2021/0408306 A1    Dec. 30, 2021

Related U.S. Application Data

(62) Division of application No. 16/502,108, filed on Jul. 3, 2019, now Pat. No. 11,158,750.

(51) Int. Cl.
*H01L 31/0352*    (2006.01)
*H01L 25/04*    (2023.01)
(Continued)

(52) U.S. Cl.
CPC .... *H01L 31/035236* (2013.01); *H01L 25/042* (2013.01); *H01L 27/1443* (2013.01); *H01L 27/1446* (2013.01); *H01L 31/02005* (2013.01); *H01L 31/02019* (2013.01); *H01L 31/02164* (2013.01); *H01L 31/022408* (2013.01);
(Continued)

(58) Field of Classification Search
CPC .............................................. H01L 31/035263
See application file for complete search history.

(56) References Cited

U.S. PATENT DOCUMENTS 4,278,474 A * 7/1981 Blakeslee .............. B82Y 20/00
                                                      257/E25.007
4,839,714 A   6/1989 Doehler et al.
(Continued)

OTHER PUBLICATIONS

"OPT3006 Ultra-Thin Ambient Light Sensor" Texas Instruments, SBOS698—Oct. 2016, 43 pages.
(Continued)

*Primary Examiner* — Christopher A Johnson
(74) *Attorney, Agent, or Firm* — Andrew R. Ralston; Frank D. Cimino

(57) ABSTRACT

A photo detector includes a superlattice with an undoped first semiconductor layer including undoped intrinsic semiconductor material, a doped second semiconductor layer having a first conductivity type on the first semiconductor layer, an undoped third semiconductor layer including undoped intrinsic semiconductor material on the second semiconductor layer, and a fourth semiconductor layer having a second opposite conductivity type on the third semiconductor layer, along with a first contact having the first conductivity type in the first, second, third, and fourth semiconductor layers, and a second contact having the second conductivity type and spaced apart from the first contact in the first, second, third, and fourth semiconductor layers. An optical shield on a second shielded portion of a top surface of the fourth semiconductor layer establishes electron and hole lakes. A packaging structure includes an opening that allows light to enter an exposed first portion of the top surface of the fourth semiconductor layer.

24 Claims, 20 Drawing Sheets

(51) Int. Cl.
   *H01L 27/144* (2006.01)
   *H01L 31/02* (2006.01)
   *H01L 31/0216* (2014.01)
   *H01L 31/0224* (2006.01)
   *H01L 31/0304* (2006.01)
   *H01L 31/103* (2006.01)
   *H01L 31/18* (2006.01)

(52) U.S. Cl.
   CPC .... *H01L 31/03048* (2013.01); *H01L 31/1035* (2013.01); *H01L 31/1848* (2013.01); *H01L 31/1852* (2013.01)

(56) References Cited

U.S. PATENT DOCUMENTS

| | | |
|---|---|---|
| 5,013,918 A | 5/1991 | Choi |
| 9,379,022 B2 | 6/2016 | Pendharkar et al. |
| 9,786,665 B1 | 10/2017 | Pendharkar et al. |
| 2008/0157291 A1 | 7/2008 | Li et al. |
| 2008/0197341 A1 | 8/2008 | Mears et al. |
| 2009/0162954 A1 | 6/2009 | Griffin, Jr. et al. |
| 2018/0122962 A1* | 5/2018 | Welser ............ H01L 31/02327 |
| 2019/0057988 A1* | 2/2019 | Huang ............ H01L 27/14649 |
| 2019/0139910 A1 | 5/2019 | Lin |
| 2020/0185560 A1* | 6/2020 | Giroud-Garampon ............ H01L 31/035263 |

OTHER PUBLICATIONS

Gulden et al., "Giant Ambipolar Diffusion Constant of n-i-p-i Doping Superlattices", Physical Review Letters, The American Physical Society, vol. 66, No. 3, Jan. 21, 1991, 4 pages.

Lin et al., "Anomalous In-Plane Drift and Diffusion of Non-Equilibrium Charge Carriers in n-i-p-i Doping Superlattices", Surface Science 228 (1990)-503, North-Holland, Elsevier Science Publishers B.V. (NBorth-Holland), 4 pages.

Gottfried H. Dohler, "Doping Superlattices ("n-i-p-i Crystals")", IEEE Journal of Quantum Electronics, vol. QE-22, No. 9, Sep. 1986, pp. 1682-1695.

* cited by examiner

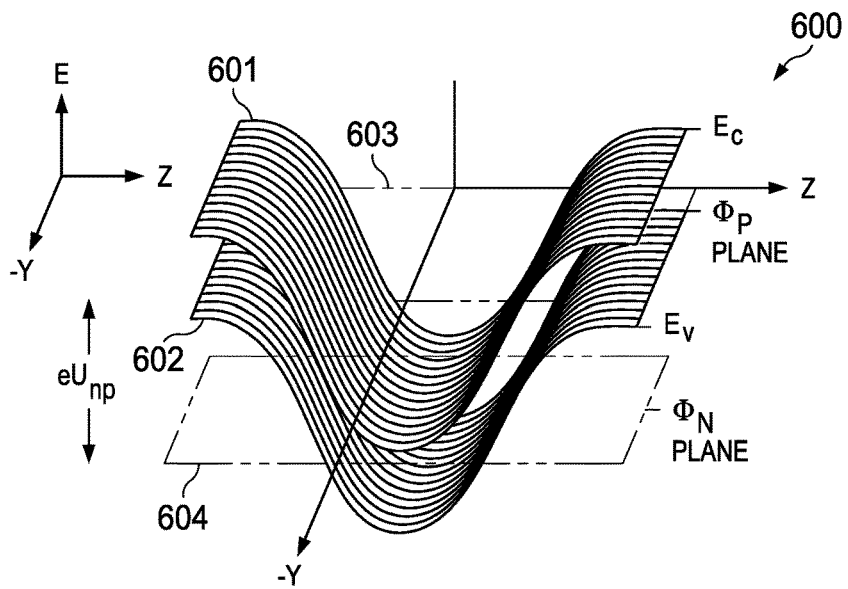
FIG. 6
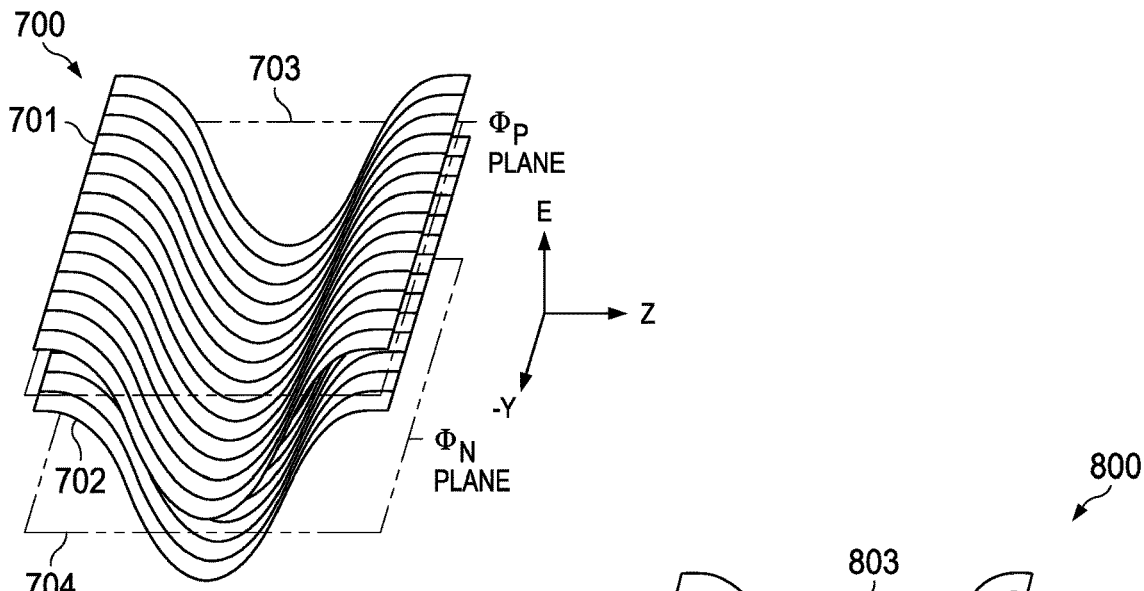
FIG. 7
FIG. 8

SUPERLATTICE PHOTO DETECTOR

CROSS-REFERENCE TO RELATED APPLICATIONS

Under 35 U.S.C. § 120, this divisional application claims the benefit of and priority to U.S. patent application Ser. No. 16/502,108, filed Jul. 3, 2019, the entirety of which is hereby incorporated herein by reference.

BACKGROUND

Photo detectors are used to sense light in a variety of applications. Some applications require high detector gain, and fast response across a wide optical spectrum range, such as from UV to infrared, for industrial automation, autonomous automotive uses, medical instruments, etc.

SUMMARY

A described example photo detector includes a superlattice with a first semiconductor layer that includes undoped intrinsic semiconductor material. The superlattice includes a second semiconductor layer with having a first conductivity type on the first semiconductor layer, a third semiconductor layer including undoped intrinsic semiconductor material on the second semiconductor layer, and a fourth semiconductor layer having a second opposite conductivity type on the third semiconductor layer. The photo detector also includes a first contact having the first conductivity type in the first, second, third, and fourth semiconductor layers, and a second contact having the second conductivity type and spaced apart from the first contact in the first, second, third, and fourth semiconductor layers.

A described method includes forming a superlattice by forming an undoped first semiconductor layer, forming a doped second semiconductor layer having a first conductivity type on the first semiconductor layer, forming an undoped third semiconductor layer on the second semiconductor layer, and forming a fourth semiconductor layer having a second opposite conductivity type on the third semiconductor layer. The method also includes implanting dopants of the first conductivity type into a first region in the first, second, third, and fourth semiconductor layers, and implanting of the second conductivity type into a second region in the first, second, third, and fourth semiconductor layers, where the first region is spaced apart from the second region.

BRIEF DESCRIPTION OF THE DRAWINGS

FIG. 6 is an energy band diagram for the superlattice N-I-P-I photo detector of FIG. 5 under reverse bias with no applied drift voltage.

FIG. 7 is an energy band diagram for the superlattice N-I-P-I photo detector of FIG. 5 with an applied reverse bias.

FIG. 8 is an energy band diagram for the superlattice N-I-P-I photo detector of FIG. 5 with input light.

DETAILED DESCRIPTION

Figure 1:
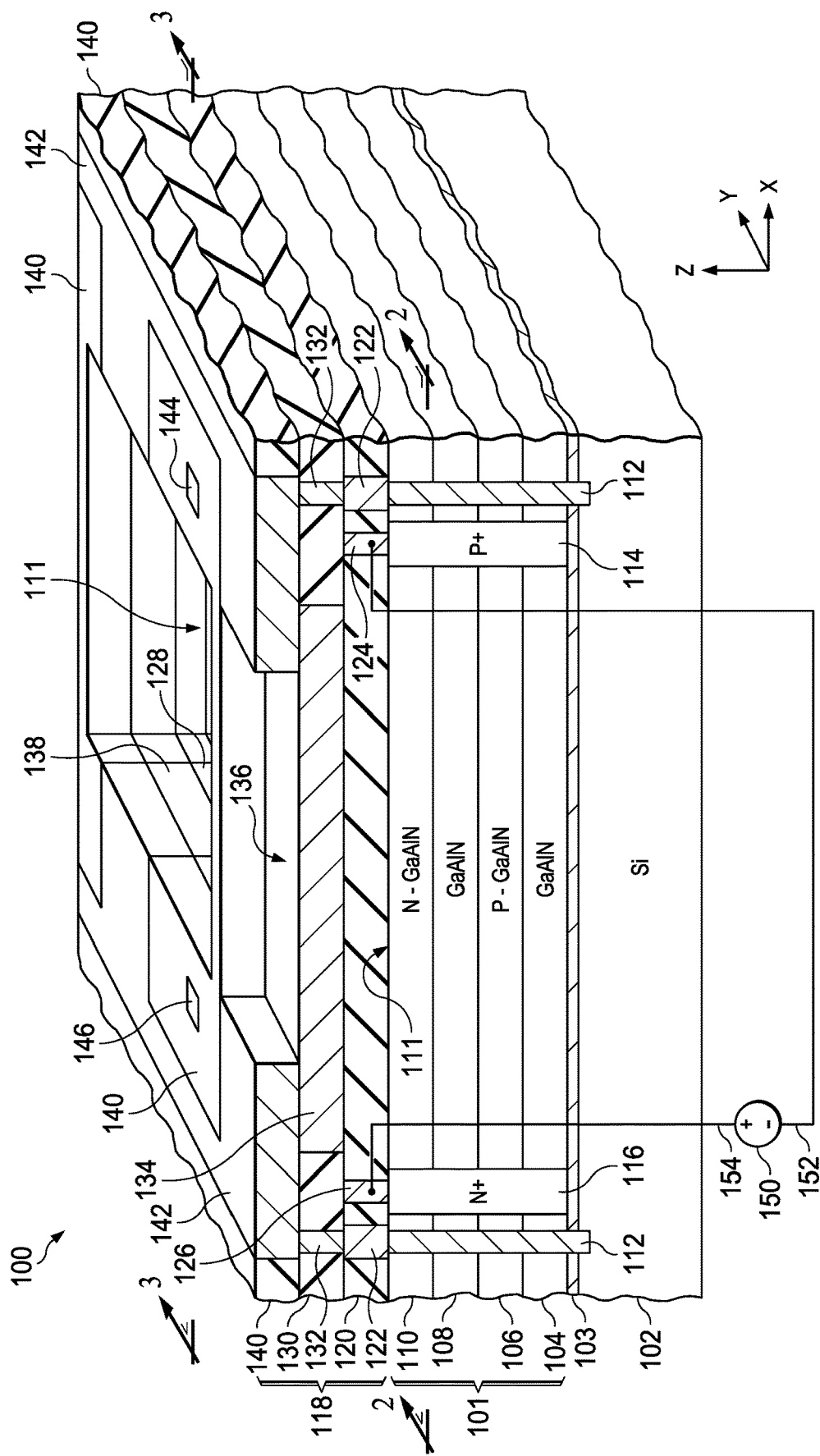
FIG. 1 is a partial sectional perspective view a multilayer superlattice photo detector.

In the drawings, like reference numerals refer to like elements throughout, and the various features are not necessarily drawn to scale. Also, the term "couple" or "couples" includes indirect or direct electrical or mechanical connection or combinations thereof. For example, if a first device couples to or is coupled with a second device, that connection may be through a direct electrical connection, or through an indirect electrical connection via one or more intervening devices and connections.

Figure 2:
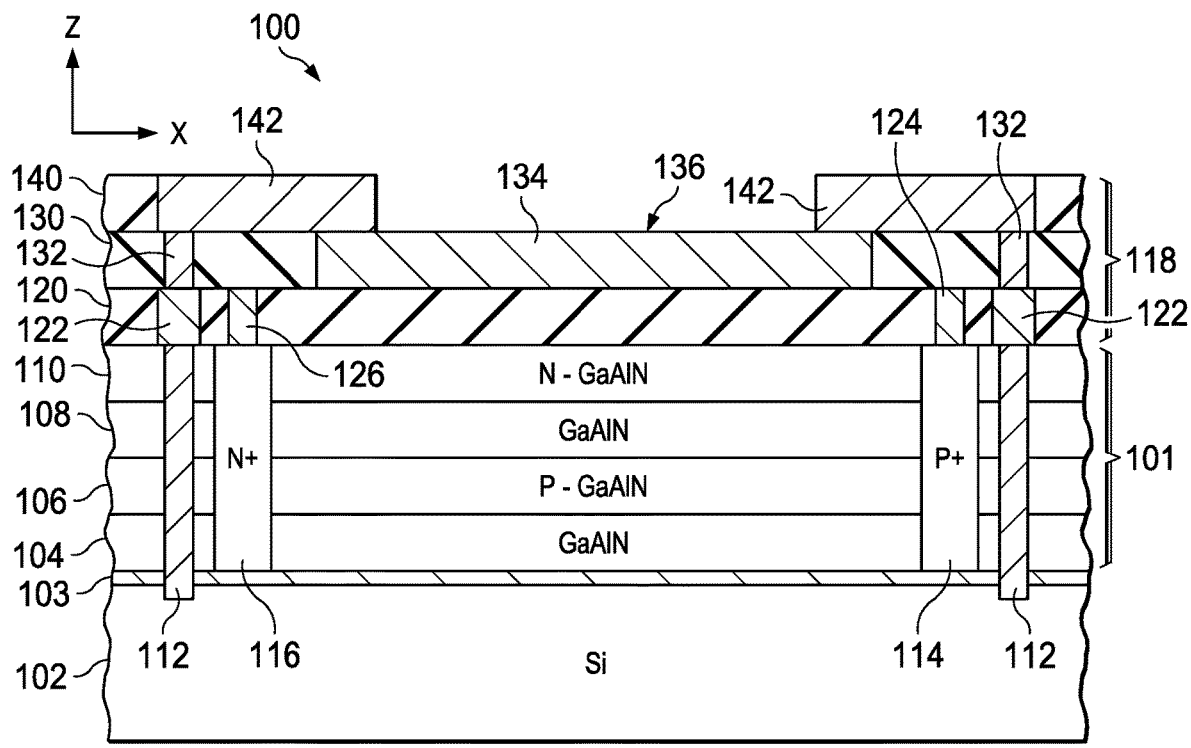
FIG. 2 is a partial sectional side elevation view of the photo detector taken along line 2-2 of FIG. 1.
Figure 3:
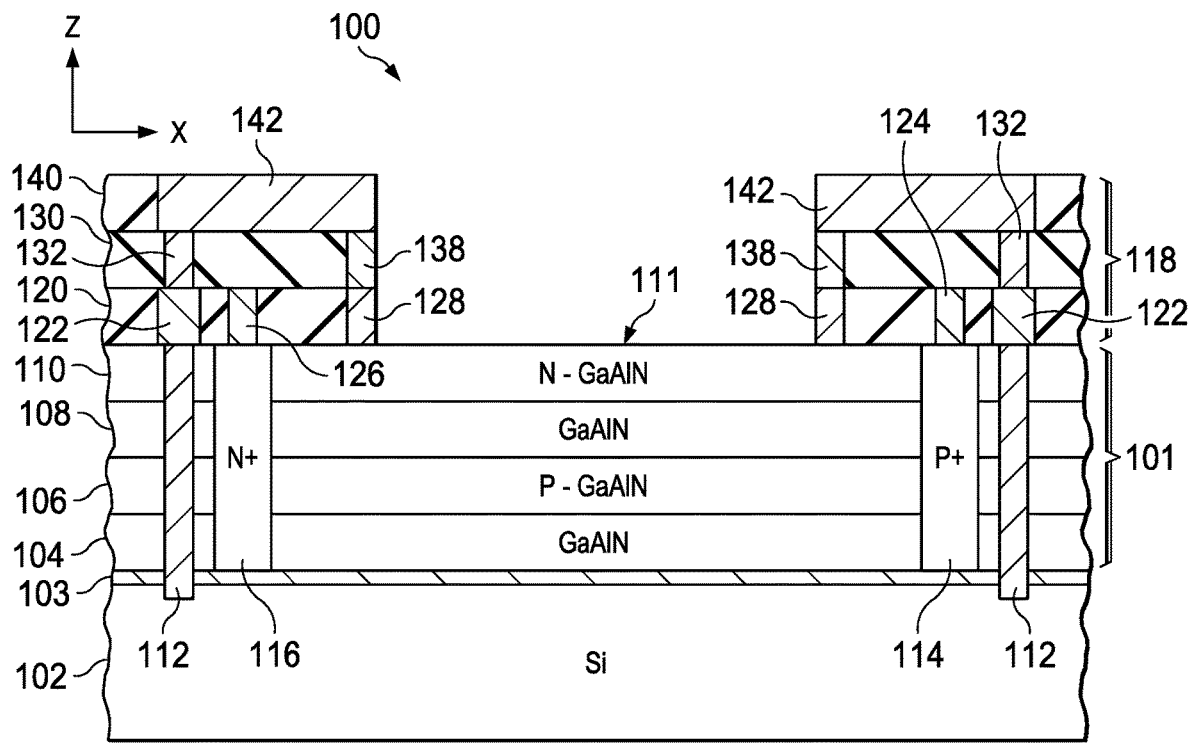
FIG. 3 is a partial sectional side elevation view of the photo detector taken along line 3-3 of FIG. 1.
Figure 4:
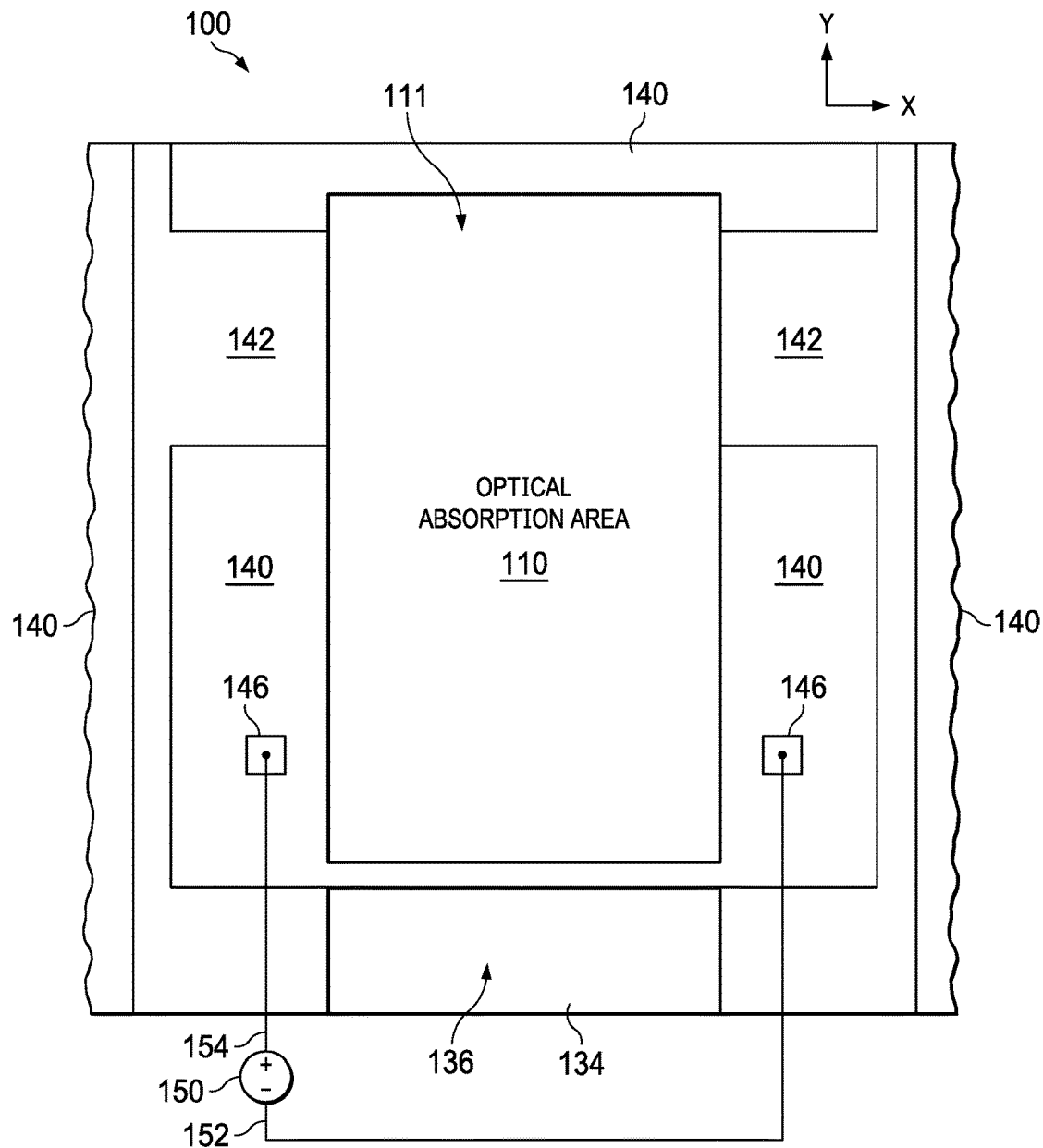
FIG. 4 is a partial schematic top view of the photo detector of FIGS. 1-3.
Figure 5:
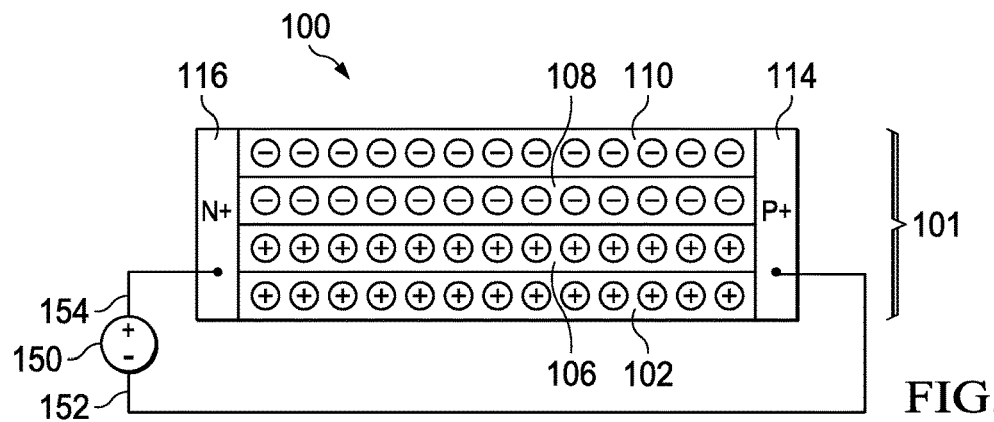
FIG. 5 is a schematic diagram of a superlattice N-I-P-I photo detector under reversed bias.
Figure 9:
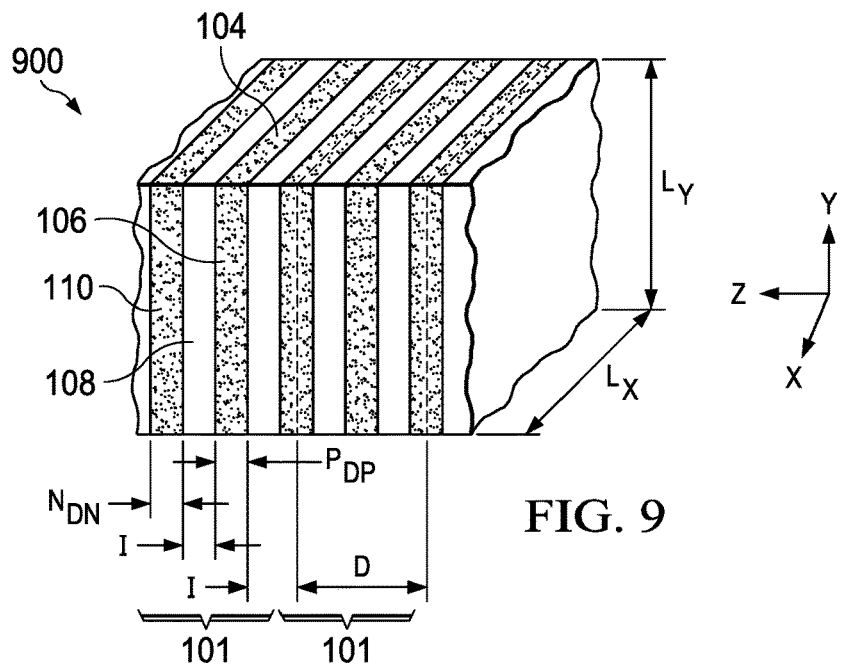
FIG. 9 is a partial sectional perspective view of a multi-wavelength photo detector structure with multiple superlattice N-I-P-I sections.

FIGS. 1-4 show an example superlattice photo detector 100 (multi-wavelength superlattice photo-detector array, or MWSPDA) with a superlattice 101. FIG. 1 shows a partial sectional perspective view the superlattice photo detector 100. FIG. 2 shows a partial sectional side view of the photo detector 100 taken along line 2-2 of FIG. 1. FIG. 3 shows a partial sectional side view taken along line 3-3 of FIG. 1, and FIG. 4 shows a partial schematic top view of the photo detector 100 of FIGS. 1-3. The superlattice 101 is formed on a substrate 102. The example photo detector 100 of FIGS. 1-4 includes a transition layer 103 between the superlattice 101 and the substrate 102. The transition layer 103 in one example provides stress matching between the first semiconductor layer 104 and the substrate 102 as well as isolation of the contact area to the substrate 102. The photo detector 100 has a single superlattice 101 with a cell formed by four semiconductor layers 104, 106, 108, and 110. Other examples include multiple stacked cells of superlattices having different wavelengths for wide bandwidth operation and sensitivity across a wide optical spectrum range. Other examples include arrays of single or multi-cell detectors for high sensitivity and high gain three-dimensional (3D) multi-wavelength superlattice photo detector array (3D MWSPDA) systems.

The first semiconductor layer 104 includes undoped intrinsic semiconductor material (sometimes referred to as an intrinsic semiconductor layer). The first semiconductor layer 104 is located over the substrate 102 (e.g., on the transition layer 103 of the substrate 102 in the example of FIGS. 1-4). The second semiconductor layer 106 is doped and has a first conductivity type (e.g., P-type, sometimes referred to as a p-type semiconductor layer). The second semiconductor layer 106 is located on the first semiconductor layer 104. The third semiconductor layer 108 includes undoped intrinsic semiconductor material located on the second semiconductor layer 106 (the third semiconductor layer 108 being sometimes referred to as an intrinsic semiconductor layer). The fourth semiconductor layer 110 has a second opposite conductivity type (e.g., N-type, sometimes referred to as an n-type semiconductor layer). The fourth semiconductor layer 110 is located on the third semiconductor layer 108.

In one example, the substrate 102 is a silicon (Si) substrate and the semiconductor layers 104, 106, 108, and 110 are or include gallium aluminum nitride (GaAlN). Any suitable substrate 102 can be used, such as silicon, a silicon-on-insulator (SOI) substrate, a high sheet resistance silicon wafer with an aluminum nitride (AlN) transition layer 103, a silicon substrate with a different transition layer material, such as silicon carbide (SiC), undoped gallium nitride (GaN), undoped SiC, etc. Further example substrates 102 that can be used include an SOI substrate 102 with a transition layer 103 that is or includes silicon and germanium (Ge), silicon and aluminum nitride, silicon and LiAlO$_2$, etc.

Other semiconductor layers can be used in other implementations. The respective semiconductor layers 104, 106, 108, and 110 can include intrinsic type, p type, n type, superlattice layers that include elemental or compound semiconductors such as IV, III-V, II-VI, etc. The individual semiconductor layers 104, 106, 108, and 110 can include the same semiconductor materials in one example. In other examples, the semiconductor layers 104, 106, 108, and 110 can be made of two or more different semiconductor materials. Suitable examples include combinations of N-I-P-I superlattice semiconductor layers 110, 108, 106, and 104, such as gallium nitride (GaN) layers (e.g., N—GaN/Intrinsic GaN/P—GaN/Intrinsic GaN, gallium arsenic (GaAs) layers (e.g., N—GaAs/Intrinsic GaAs/P—GaAs/Intrinsic GaAs), etc. Other examples include a hetero-junction superlattice 110, 108, 106, and 104, such as N—GaAlN/Intrinsic GaN/P—GaAlN/Intrinsic GaN, N—GaPAs/Intrinsic GaAs/P—GaPAs/Intrinsic GaAs, etc. The respective semiconductor layers 104, 106, 108, and 110 can be deposited using any suitable deposition and/or growth processing steps, such as epitaxial growth (e.g., epitaxy), metal organic chemical vapor deposition (MOCVD, sometimes called metal organic vapor phase epitaxy or MOVPE), molecular-beam epitaxy (MBE), etc., or combinations thereof.

The fourth semiconductor layer 110 includes an upper or top surface 111 that forms a top side of the superlattice 101. The surface 111 includes an exposed first portion that is configured to receive incoming light. In the example of FIGS. 1-3, the first portion of the surface 111 is exposed through an opening in an upper metallization structure 118 to receive light in the −Z direction.

The photo detector 100 also includes an isolation structure 112 that surrounds a portion of the superlattice 101. In the example of FIGS. 1-4, the isolation structure 112 is a deep trench isolation structure that laterally surrounds all or a portion of the semiconductor layers 104, 106, 108, and 110 of the superlattice 101 in the X-Y plane. In one implementation, the isolation structure 112 includes a trench that extends downward through the semiconductor layers 104, 106, 108, and 110 of the superlattice 101, through the transition layer 103, and into the substrate 102. The trench is filled with highly doped polysilicon that electrically isolates the superlattice 101 from other circuitry of the photo detector 100. In another implementation, the isolation structure 112 is formed using shallow trench isolation (STI) processes to isolate the superlattice 101 from other circuitry of the photo detector 100.

The photo detector 100 includes contacts to apply a bias voltage to the superlattice 101. The example in FIG. 1 includes a first contact 114 having the first conductivity type (e.g., p-type, including p-type majority carrier dopants). The first contact 114 is located in a first implanted region or portion (e.g., labeled "P+" in FIGS. 1-3) in the respective first, second, third, and fourth semiconductor layers 104, 106, 108, and 110. The first implanted region 114 has a higher carrier concentration than the second and fourth semiconductor layers 106 and 110. The photo detector 100 also includes a second contact 116 having the second conductivity type (e.g., n-type, including n-type majority carrier dopants). The second contact 116 is located in a second implanted region or portion (e.g., labeled "N+) in the respective first, second, third, and fourth semiconductor layers 104, 106, 108, 110. The second implanted region 116 has a higher carrier concentration than the second and fourth semiconductor layers 106 and 110. The respective N+ and P+ contact areas 116 and 114 in one example land on the transition layer 103 which is located between the first semiconductor layer 104 and the substrate 102.

The upper metallization structure 118 has an opening that allows light to enter the exposed first portion of the top surface 111 of the superlattice 101 to receive incoming light generally along the −Z direction in FIGS. 1-3 in a portion of the semiconductor layers 104, 106, 108, and 110 labeled "OPTICAL ABSORPTION AREA" in FIG. 4. The metallization structure 118 is a multi-level structure with a dielectric layer 120 located over a shielded second portion of the surface 111 of the superlattice 101. One or more electrically conductive contacts 122 (e.g., tungsten, titanium, titanium nitride, copper, etc. or combinations thereof) extend through the dielectric layer 120 to provide electrical connection to the isolation structure 112. One or more conductive contacts 124 (e.g., tungsten, titanium, titanium nitride, copper, etc. or combinations thereof) extend through the dielectric layer 120 to provide electrical connection to the P+ first contact 114. One or more further conductive contacts 126 (e.g., tungsten, titanium, titanium nitride, copper, etc. or combinations thereof) extend through the dielectric layer 120 to provide electrical connection to the N+ second contact 116. As shown in FIGS. 1 and 3, one or more contacts 128 (e.g., tungsten, titanium, titanium nitride, copper, etc. or combinations thereof) extend through the dielectric layer 120 to provide electrical connection between the surface 111 of the superlattice 101 and the isolation structure 112.

A further dielectric layer 130 extends on the first dielectric layer 120. In one example, the dielectric layer 130 is referred to as a pre-metal dielectric or PMD layer as labeled in FIGS. 1-3. One or more electrically conductive contacts 132 (e.g., tungsten, titanium, titanium nitride, copper, etc. or combinations thereof) extend through the PMD dielectric layer 130 to provide electrical connection to the isolation structure 112 via the contact(s) 122. The photo detector 100 also includes an optical shield 134 that prevents or inhibits light from entering the second portion of the surface 111 of the superlattice 101. In one example, the optical shield 134 is or includes a conductive metal material, such as tungsten, titanium, titanium nitride, copper, etc. or combinations thereof. In the example of FIGS. 1-4, the stack of the layers 120 and 134 provides an optical shield that prevents or inhibits light from entering the second portion of the surface 111 of the superlattice 101. In another example, a conductor is formed on the second portion of the surface 111 of the superlattice 101 and a dielectric is formed over this conductor to provide an optical shield stack. As shown in FIGS. 1 and 3, one or more contacts 138 (e.g., tungsten, titanium, titanium nitride, copper, etc. or combinations thereof) extend through the PMD dielectric layer 130 to provide electrical connection between the surface 111 of the superlattice 101 and the isolation structure 112.

The example conductive shield 134 in FIGS. 1-4 includes an upper or top side 136 exposed through an opening in an interlayer or interlevel dielectric (ILD) layer 140. This upper level of the example metallization structure 118 includes a conductive metal routing feature 142 (e.g., tungsten, titanium, titanium nitride, copper, etc. or combinations thereof) that provides electrical connection of the electrically conductive contacts 132 to the conductive optical shield 134 (FIGS. 1 and 2) and to the contacts 138 (FIGS. 1 and 3). The photo detector 100 also includes a contact 144 (e.g., tungsten, titanium, titanium nitride, copper, etc. or combinations thereof) exposed through the ILD dielectric layer 140 on the top side of the photo detector 100 to provide electrical connection of the first contact 114 to an external voltage source. In one example, the contact 144 is electrically connected to the first contact 114 through the contact 124 and further intervening conductive contacts or routing layer features (not shown) that extend through corresponding portions of the dielectric layer 130. The photo detector 100 also includes a contact 146 (e.g., tungsten, titanium, titanium nitride, copper, etc. or combinations thereof) exposed through the ILD dielectric layer 140 on the top side of the photo detector 100 to provide electrical connection of the second contact 116 to the external voltage source. In one example, the contact 146 is electrically connected to the contact 116 through the contact 126 and through further intervening conductive contacts or routing layer features (not shown) that extend through corresponding portions of the dielectric layer 130. FIG. 1 schematically shows a DC voltage source 150 with a first (e.g., negative or "−") terminal 152 connected to the first contact 114 through the contact 124, as well as a second (e.g., positive or "+") terminal 154 connected to the second contact 116 through the contact 126.

The example photo detector 100 in FIGS. 1-4 has a single cell including N-I-P-I superlattice semiconductor layers 110, 108, 106, and 104, respectively, in which the first semiconductor layer 104 is located between the transition layer 103 and the second semiconductor layer 106, and the fourth semiconductor layer 110 includes the upper or top surface 111 of the superlattice 101. In another implementation, the N and P semiconductor layers can be reversed. In another implementation, one of the doped semiconductor layers extends on the substrate 102, and one of the intrinsic semiconductor layers forms the top of the superlattice cell, including the surface 111. In other examples (e.g., FIGS. 33 and 34 below), the photo detector includes multiple cells stacked on top of one another. The photo detector 100 can be a single-chip packaged semiconductor device with conductive pads for soldering to a host PCB (printed circuit board) in a single detector application or in multi-detector arrays (e.g., FIGS. 27 and 28 below). In other implementations, multiple photo detectors (single cell and/or multiple cell superlattice photo detector array) can be provided in a single-chip packaged semiconductor device (e.g., FIG. 29).

The described example photo detectors 100 and systems can be used in a wide variety of applications, such as industrial electronics and automotive applications. The photo detector 100 can be used in a single detector configuration or in an array to facilitate high gain and high sensitivity detection over a wide range of wavelengths, such as from UV to infrared, etc. High gain and sensitivity, as well as wide bandwidth are desirable for various industry applications, such as artificial intelligence (AI), autonomous motor vehicles, medical instruments. In addition, the described photo detectors 100 and systems can be used to construct optical random-access memory (RAM) devices with optical write and electrical read capabilities, etc. Certain implementations include high sensitivity, high gain three-dimensional photo detector systems (e.g., 3D MWSPDA systems). The individual photo detector units include single or multi cell configurations cell, with individual cells including N-I-P-I semiconductor layers (e.g., 104, 106, 108, 110) with multiple P+ and N+ contacts 114 and 116, respectively.

Figure 12:
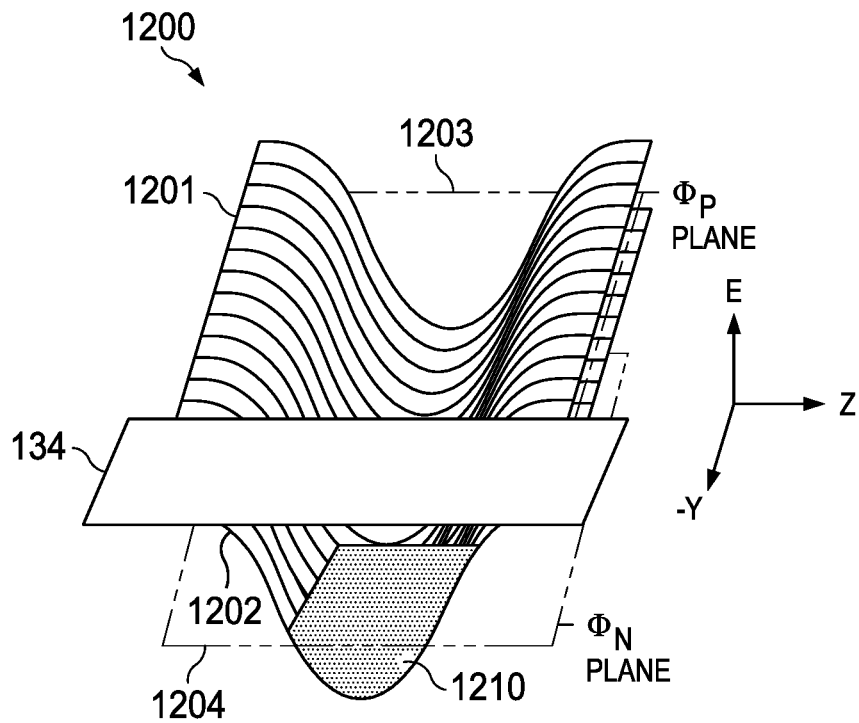
FIG. 12 is an energy band diagram for the photo detector of FIG. 9 showing an electron Lake formed under an optically shielded area.

Described examples also include optical shield portions 120, 134 to provide optical absorption blocking areas with dielectric and metal. In operation, photo-generated electrons and holes are driven both by applied electrical fields through biasing of the contacts 114, 116, as well as by the gradient of photo generated carrier density, or by either of these mechanisms. In addition, the optical shield portions 120, 134 form a two dimensional electron lake in the optical absorption blocking areas as shown in FIG. 12 below, as well as a spatially separated two dimensional hole lake in the same area. In one example, a reverse bias is applied to the contacts 114, 116 (e.g., as schematically shown in FIGS. 1 and 4) to set operation in the absence of incoming light slightly below the threshold voltage of the photodiode or transistor provided by the N-I-P-I superlattice cell 101. In another example DC voltage source 150 is set to bias the photo detector 100 above the threshold voltage for depletion mode operation to detect incoming photons. The availability of carriers in the electron or hole lake under the optical shield portions 120, 134 enhances sensitivity to received photons, in which a two dimensional electron and hole lake is formed and controlled by the electrical field applied through the P+ and N+ contacts 114 and 116, respectively. The optical shield portions 120, 134 can be designed in certain implementations to facilitate use of the detectors 100 as an optical memory device, such as an optical RAM with optical write and electrical read capabilities. The two dimensional electron lake formed during operation of the photo detector 100 is tunable by the incident light intensity, the size and shape of the optical shielding area, the optical absorption properties of the superlattice material, etc. Moreover, the flexibility of using different superlattice materials with different band gaps along with homo and hetero junction approaches facilitates high sensitivity and wide bandwidth photo detection under the special designed optical shielding area.

Referring also to FIGS. 5-8, FIG. 5 shows a superlattice N-I-P-I junction of the photo detector 100 with a single cell superlattice 101 including the semiconductor layers 104, 106, 108, and 110 under reversed bias. The DC voltage source 150 in this example applies a reverse bias voltage V=Vt, where the charge Q=0, and C=dQ/dV=0. FIGS. 6-8 show two-dimensional energy band diagrams of superlattice N-I-P-I photo detector. FIG. 6 shows an energy band diagram 600 for the reverse biased superlattice N-I-P-I photo detector 100 with no applied drift voltage. The energy band diagram 600 shows a first band 601 and a lower second band 602 that illustrate the energy levels (along the "E" direction) in the X-Z plane of the photo detector 100 in FIGS. 1-4. FIG. 6 also shows a plane 603 that shows $\Phi_P$, a plane 604 that shows $\Phi_N$, and the difference energy $eU_{np}$ between the planes 603 and 604. FIG. 7 shows the energy band diagram 700 with an applied reverse bias and no input light. The energy band diagram 700 includes a first band 701 and a second band 702 along with a $\Phi_P$ plane 703 and a $\Phi_N$ plane 704. FIG. 8 shows an energy band diagram 800 with a first band 801, a second band 802, a $\Phi_P$ plane 803 and a $\Phi_N$ plane 804 for the reverse biased superlattice N-I-P-I photo detector 100 with input light. FIG. 8 also shows a plane 805 illustrating the effect of the input light, as well as the $\Phi$ change amount 806 $\Delta\Phi_0^{photo}$. The reverse bias of the superlattice photo detector controls the size of the electron and hole lake. In addition, the optical response time and gain of the photo detector is directly related to the size of the photo-generated two-dimensional carrier lake. Ultra-high speed photo response performance can be achieved for a given application by the design of the photo shielding area, the device layout and the control of the reverse bias voltage. For example, some implementations of the photodetector 100 consistent with the disclosure may operate with a response time to a step increase of light flux less than about 1 ns, or may operate with a signal bandwidth of more than about 1 GHz.

Figure 10:
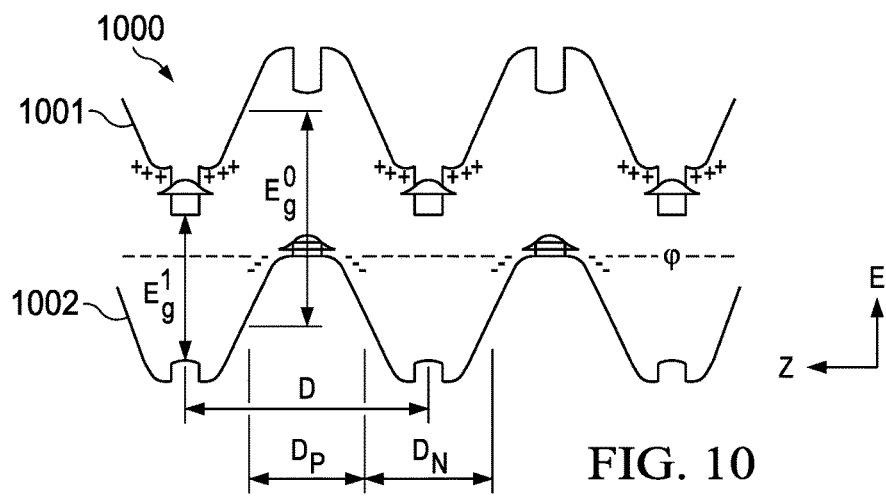
FIG. 10 is an energy band diagram for the photo detector of FIG. 9 for a reverse bias with no illumination.
Figure 11:
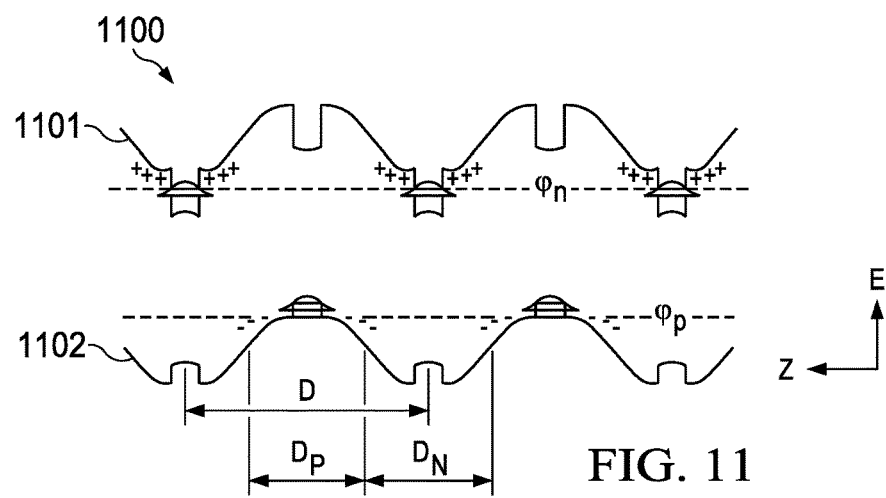
FIG. 11 is an energy band diagram for the photo detector of FIG. 9 for a reverse bias with illumination.

Referring also to FIGS. 9-13, FIG. 9 shows a photo detector structure 900 with multiple stacked superlattice N-I-P-I sections 101. FIGS. 10-12 show energy band gap diagrams of a high sensitivity and high gain multilayer hetero 3D MWSPDA. FIG. 10 shows an example energy band diagram 1000 for the structure 900 under a reverse bias with no illumination. The energy band diagram 1000 includes a first band 1001 and a second band 1002 shown across multiple cells of the stacked multi-cell superlattice structure 900. An energy band diagram 1100 and FIG. 11 shows first and second bands 1101 and 1102 for a reverse bias superlattice condition with illumination. FIG. 12 shows an energy band diagram 1200 including multi-dimensional bands 1201 and 1202 at different positions along the $-Y$ direction, along with a $\Phi_P$ plane 1203 and a $\Phi_N$ plane 1204 for the reverse biased condition with illumination by incoming light along the $-Z$ direction. FIG. 12 also shows the shielded or dark region under the optical shield 134. During operation, a two-dimensional electron lake 1210 forms in the shaded area under the optical shield 134.

Figure 13:
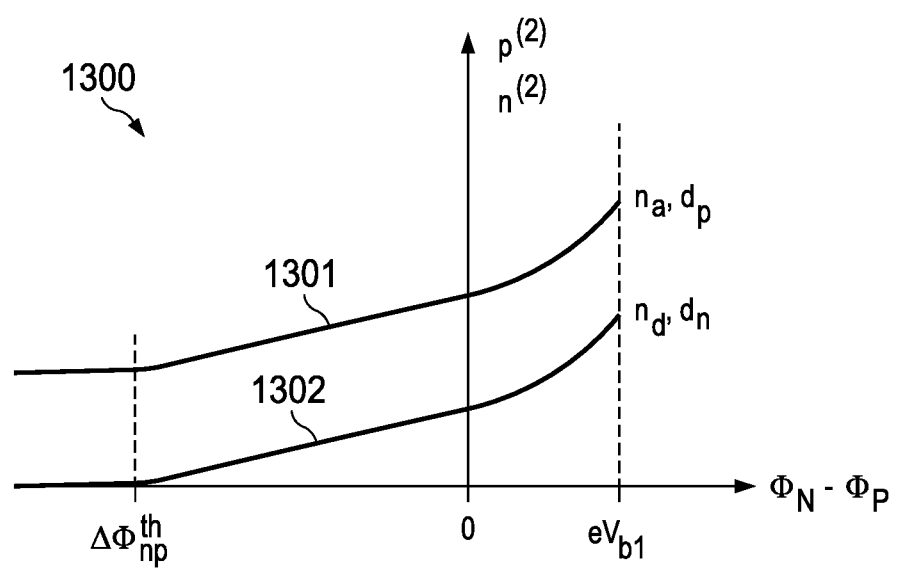
FIG. 13 is a graph of charge density as a function of electric field for an N-I-P-I superlattice structure.

FIG. 13 shows a graph 1300 with curves 1301 and 1302 that show the dependence of two-dimensional charge carrier density $n^{(2)}$ for electrons and $p^{(2)}$ for holes, respectively, as a function of electric field $\Phi_n$-$\Phi_p$ for the N-I-P-I superlattice structure 101 with a bias voltage at the threshold voltage Vt, Q (Toatl Charge)=0, and C (Total Capacitance)=dQ/dV=0, where $\Phi n$ is the two dimensional electron energy and $\Phi p$ is the two dimensional hole energy, respectively. The first curve 1301 shows $n_a*d_p$, and the second curve 1302 shows $n_d*d_n$ as a function of the electric field $\Phi_n$-$\Phi_p$ between $\Delta\Phi_{np}^{th}$ (the threshold energy while the superlattice layers are fully depleted) and $eV_{bi}$, (the build-in energy of the superlattice layers) where $n_d$ is the donor concentration, dn is the n layer width, na is the acceptor concentration, dp is the p layer width, respectively. In one example, the two-dimensional electron and hole current $J_n$, $J_p$ is given as: $J_n$=−$eD_n^{nipi}$ $\Delta n/L$, $J_p$=−$eD_p^{nipi}$ $\Delta p/L$, where $\tilde{D}_n^{nipi}$=$D_p^{nipi}$=$D_a^{nipi}$= $((1/\sigma_n+1/\sigma_p)^{-1})/((dn/d)(\Phi_n-\Phi_p)/e^2)$, where $\sigma_n$, the electron conductivity, $\sigma_p$, the hole conductivity, $D_n^{nipi}$ is the two dimensional electron diffusion constant, $D_p^{nipi}$, is the two dimensional hole diffusion constant for N-I-P-I superlattice, respectively.

Figure 14:
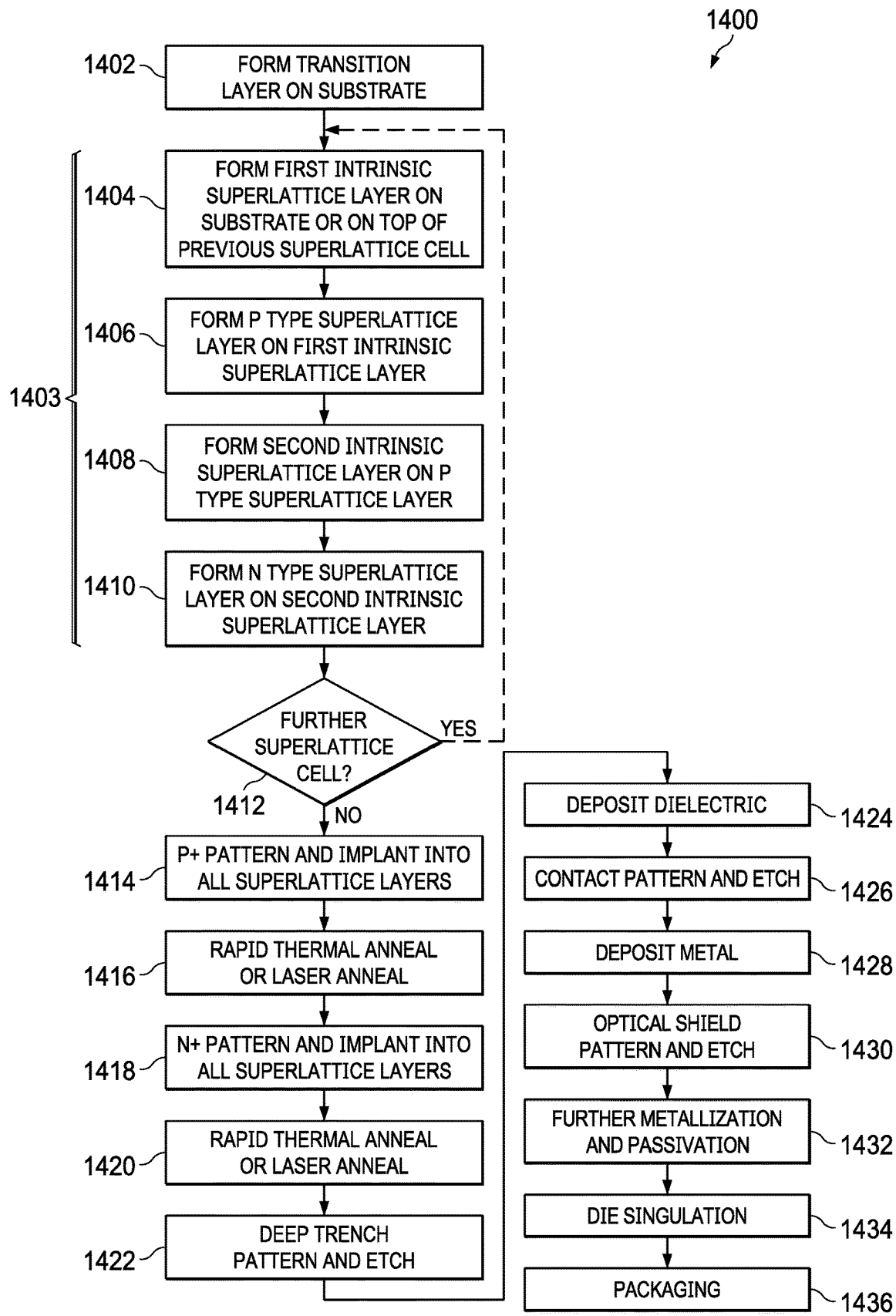
FIG. 14 is a method of fabricating a photo detector packaged electronic device.
Figure 15:
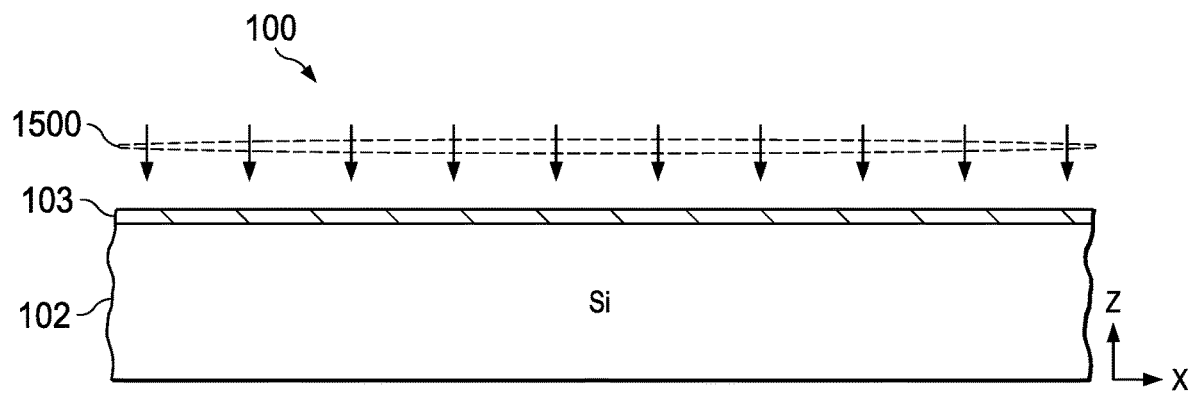
FIGS. 15-26 are partial sectional side elevation views of the photo detector device of FIGS. 1-4 undergoing fabrication processing according to the method of FIG. 14.

Referring now to FIGS. 14-26, FIG. 14 shows a method 1400 of fabricating a detector packaged electronic device, and FIGS. 15-26 show the photo detector 100 of FIGS. 1-4 undergoing fabrication processing according to the method of 1400. The method 1400 is described in the context of fabrication of a single unit, whether single cell or stacked multi-cell configuration. In certain implementations, multiple photo detector units, e.g., a detector array, can be fabricated concurrently on a single chip using the described method 1400. The method 1400 begins with forming a transition layer on a provided substrate at 1402 (e.g., transition layer 103 formed on a top side of the substrate 102 in FIGS. 1-4). Any suitable starting substrate can be provided at 1402, such as silicon, a silicon-non-insulator (SOI) substrate, a high sheet resistance silicon wafer with an aluminum nitride (AlN) transition layer 103 a silicon substrate with a different transition layer material, such as silicon carbide (SiC), undoped gallium nitride (GaN), undoped SiC, etc. Further examples substrates 102 that can be used include an SOI substrate 102 with a transition layer 103 that is or includes silicon and germanium (Ge), silicon and aluminum nitride, silicon and LiAlO$_2$, etc. FIG. 15 shows one example in which a process 1500 is performed at 1402 to form the transition layer 103 on the starting substrate 102. A transition layer 103 is useful for a silicon based III-V superlattice device in one example.

The method 1400 in FIG. 14 also includes forming a superlattice at 1403, such as the superlattice 101 in FIGS. 1-4 above. In the example of FIG. 14, the processing at 1403 forms a single N-I-P-I multi-layer structure including four semiconductor layers (e.g., 104, 106, 108, and 110 above), and the processing at 1403 can be repeated one or more times to provide multiple stacked cells individually including N type, Intrinsic type and P type superlattice layers with a given desired set of semiconductor materials, thicknesses and doping levels. The semiconductor layers of a given cell can be deposited or otherwise formed at 101 using a variety of different deposition processes, such as atomic layer deposition (ALD), MBE, MOCVD processes, etc., or combinations thereof.

Figure 16:
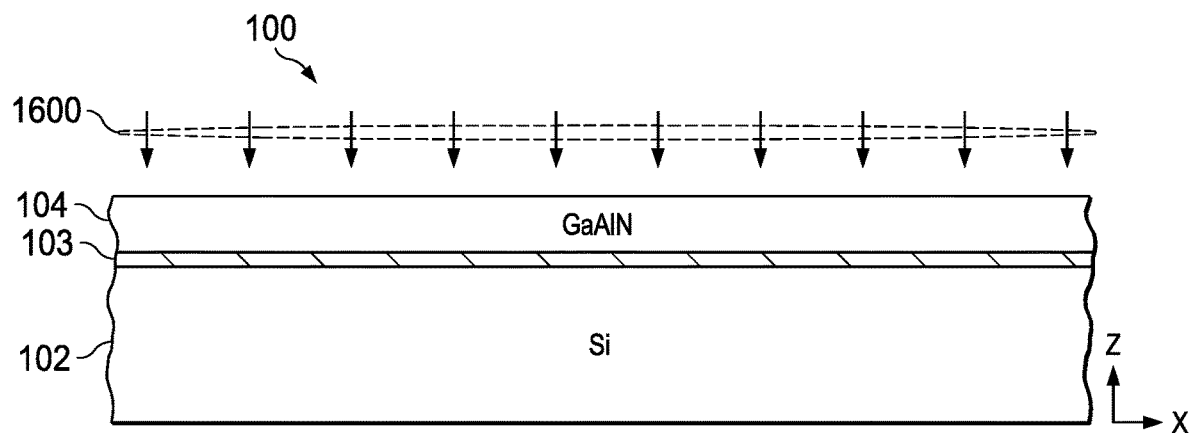

The superlattice formation at 1403 in one example includes forming an undoped first semiconductor layer at 1404. FIG. 16 shows one example, in which a deposition process 1600 is performed that deposits the first semiconductor layer 104 on the substrate (e.g., and on any included transition layer 103). In the illustrated example, epitaxial growth deposition is used for the deposition process 1600 to form the first semiconductor layer 104, as well as the subsequent semiconductor layers 106, 108, and 110 of the superlattice cell 101. In one example, the deposition process 1600 forms the first intrinsic superlattice layer 104 on the substrate 102, or on top of a previous superlattice cell. In one example, the process 1600 is an epitaxial growth process that deposits GaAlN to a thickness of 10 to 100 nm (e.g., Ga(X)Al(Y)N). Different materials and/or thicknesses can be used in other examples.

Figure 17:
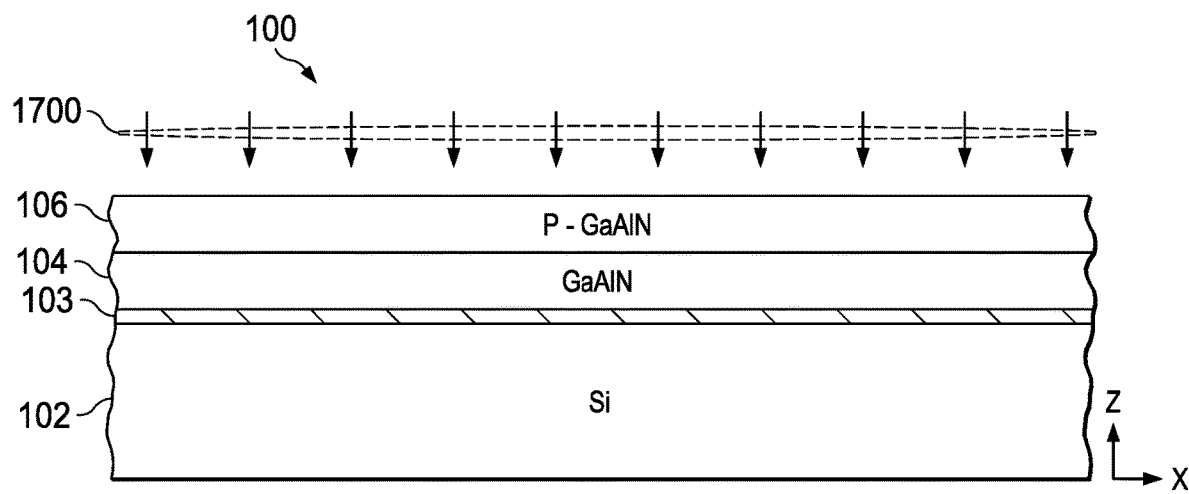

The method 1400 continues at 1406 with forming a doped second semiconductor layer (e.g., the second semiconductor layer 106) having a first conductivity type (e.g., P) on the first semiconductor layer 104. FIG. 17 shows one example, in which a deposition process 1700 (e.g., epitaxial growth) is performed while introducing p-type dopants. The process 1700 deposits the doped second semiconductor layer 106 on the first (e.g., intrinsic, undoped) semiconductor layer 104. In one example, the process 1700 is an epitaxial growth process that deposits a p-type GaAlN layer 106 to a thickness of 50 to 500 nm, with a p-type doping concentration of 2 to 6 E16 $cm^{-3}$) (e.g., Ga(X)Al(Y)N). In other implementations, different materials, thicknesses and/or dopant concentrations can be used.

Figure 18:
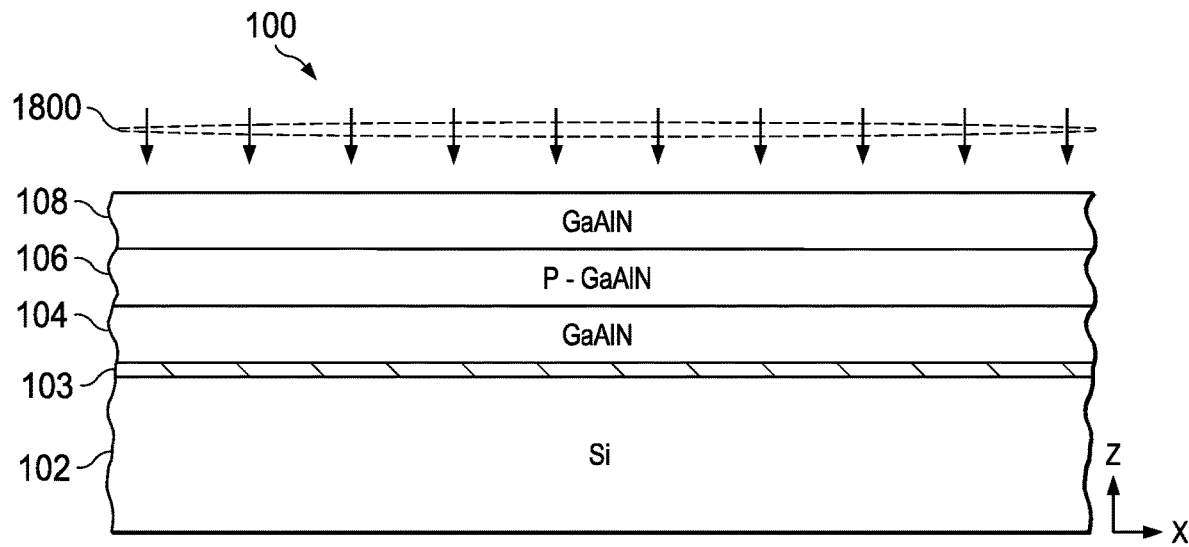

The superlattice formation at 1403 continues at 1408 with forming an undoped third semiconductor layer. FIG. 18 shows one example, in which an example epitaxial growth deposition process 1800 is performed that deposits the undoped third semiconductor layer 108 on the second semiconductor layer 106. In one example, the process 1800 is an epitaxial growth process that deposits intrinsic (e.g., undoped) GaAlN to a thickness of 10 to 100 nm (e.g., Ga(X)Al(Y)N). Different materials and/or thicknesses can be used in other examples.

Figure 19:
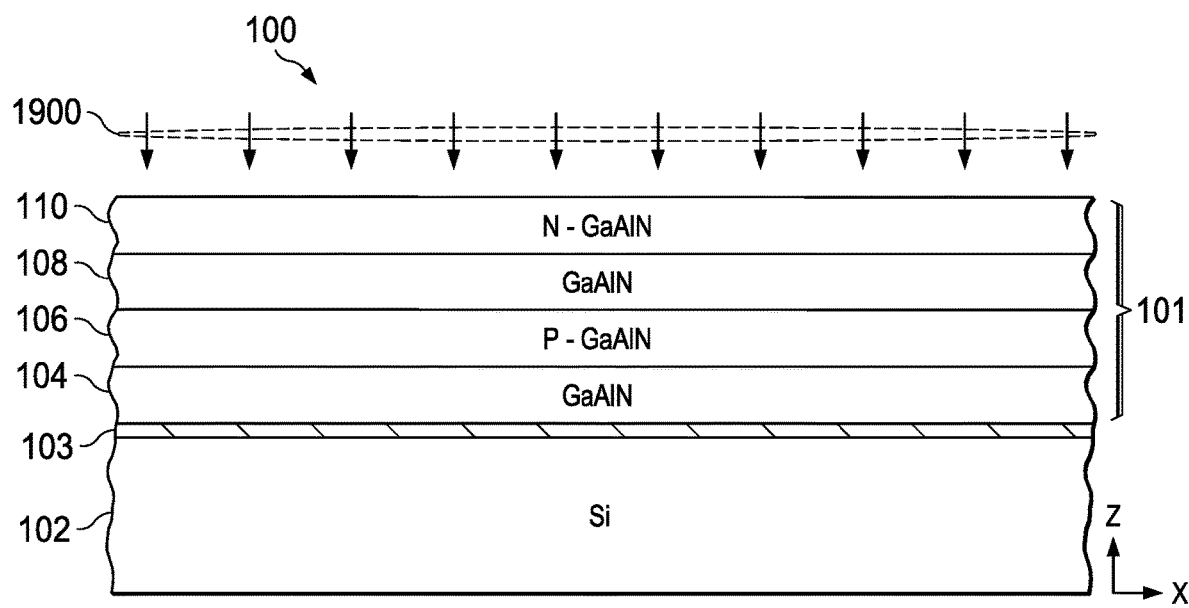

The method 1400 also includes forming a fourth semiconductor layer at 1410 (e.g., the layer 110) having a second conductivity type (e.g., N) on the third semiconductor layer 108. FIG. 19 shows one example, in which an epitaxial deposition process 1900 deposits the n-type fourth semiconductor layer 110 on the third semiconductor layer 108. The process 1900 in one example is an epitaxial growth process that deposits an n-type GaAlN layer 110 to a thickness of 30 to 500 nm, with an n-type doping concentration of 2 to 6 E16 $cm^{-3}$) (e.g., Ga(X)Al(Y)N). In other implementations, different materials, thicknesses and/or dopant concentrations can be used.

The deposition processing 1403 at 1404, 1406, 1408, and 1410 creates a four-layer N-I-P-I section or cell 101, in this example, the layers 104, 106, 108, and 110. A determination is made at 1412 as to whether a further superlattice cell is to be fabricated. If so (YES at 1412), the method 1400 returns to form a further cell at 1403, including the formation steps at 1404, 1406, 1408, and 1410 as previously described. The formation of the intrinsic and doped semiconductor layers formed at 1403 can be any suitable process that forms superlattice layers, such as Epitaxy, MOCVD, MBE, etc. or combinations thereof that form element or compound semiconductors such as IV, III-V, II-VI, etc.

Figure 20:
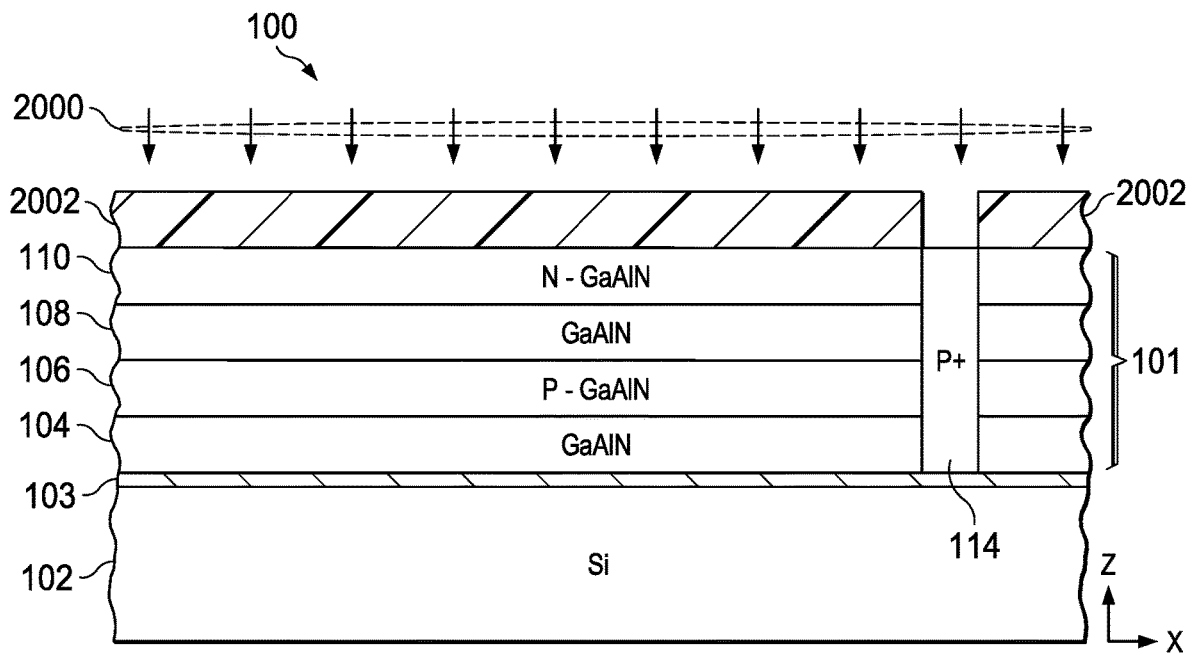

If no further superlattice cell or cells are desired (NO at 1412), the method continues with contact formation, isolation structure fabrication, and further device fabrication processing, beginning at 1414. P+ and N+ contacts in one example are formed by implantation and annealing, although any suitable contact formation processing can be used in other implementations. At 1414 and 1416, the method 1400 includes forming a first p-type contact (e.g., P+ contact 114 in FIGS. 1-4). FIG. 20 shows one example, in which a p-type implantation process 2000 is performed using a first implant mask 2002. The implantation process 2000 implants dopants of the first conductivity type (e.g., P) into a first region in the first, second, third, and fourth semiconductor layers 104, 106, 108, and 110. In this example, the implantation processing at 1414 includes depositing and patterning an implantation mask material 2002 that includes an opening above the first region, and implantation of boron, Be, Mg or other p-type dopants or impurities through the opening of the mask 2002 using suitable implantation energy to implant the p-type dopants into the first region of the semiconductor layers 104, 106, 108, and 110.

At 1416 in FIG. 14, the method 1400 also includes rapid thermal annealing (RTA) or laser annealing to activate the implanted p-type dopants in the first implanted region. In one example, the mask 2002 is removed prior to rapid thermal annealing at 1416. Another example includes laser annealing at 1416, followed by removal of the mask 2002. Other suitable annealing techniques can be used. RTA or laser annealing advantageously mitigates excessive lateral diffusion of the implanted dopants. In one example, the implanted and annealed first implanted region 114 has a higher p-type carrier concentration than the doped second and fourth semiconductor layers 106 and 110.

Figure 21:
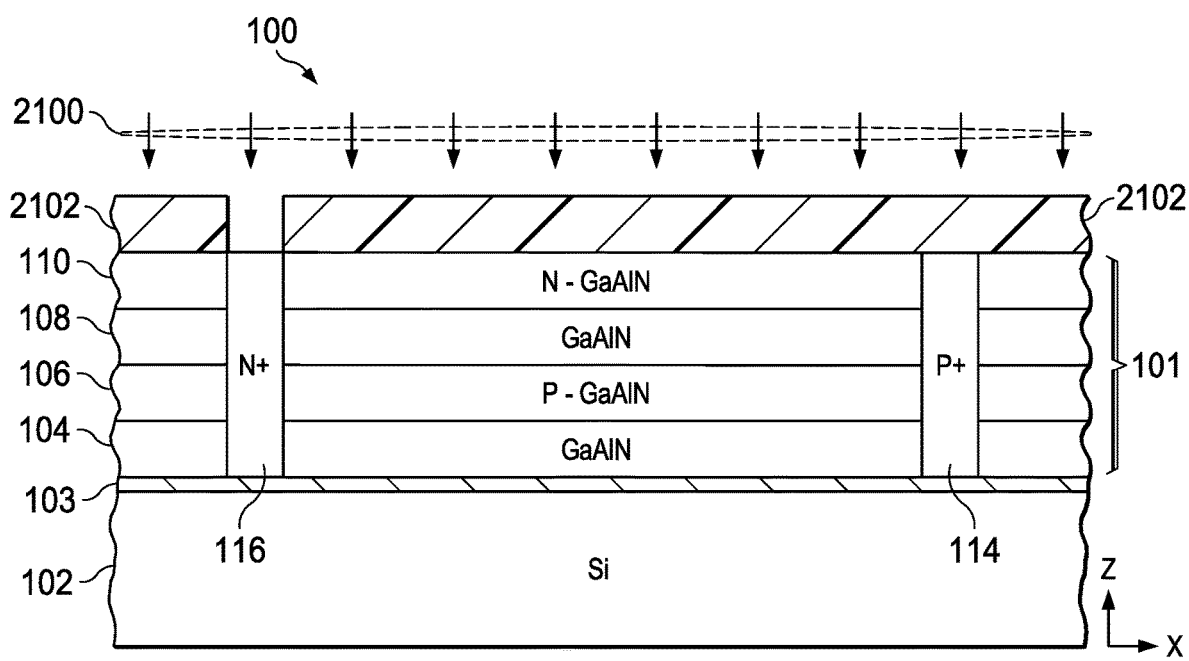

The method 1400 continues at 1418 and 1420 with forming a second contact (e.g., N+ contact 116 in FIGS. 1-4). At 1418, the method includes implanting dopants of the second conductivity type (e.g., N) into a second region, spaced apart from the first region, in the first, second, third, and fourth semiconductor layers 104, 106, 108, and 110. FIG. 21 shows one example, in which an n-type implantation process 2100 is performed using a second implant mask 2102. The implantation process 2100 implants dopants of the second conductivity type (e.g., N) into a second region in the first, second, third, and fourth semiconductor layers 104, 106, 108, and 110. In this example, the implantation processing at 1418 includes depositing and patterning a second implantation mask material 2102 that includes an opening above the second region, and implantation of silicon (Si) for III-nitride, such as GaN, GaAs, etc., phosphorus for silicon, or other n-type dopants or impurities through the opening of the second implantation mask 2102 using suitable implantation energy to implant the n-type dopants into the second region of the semiconductor layers 104, 106, 108, and 110.

The example method 1400 also annealing at 1420, such as rapid thermal annealing (e.g., after the mask 2102 is removed) or laser annealing (e.g., prior to mask removal) to activate the implanted n-type dopants in the second implanted region while mitigating excessive lateral diffusion of the implanted dopants. In one example, second implanted region 116 has a higher carrier concentration than the second and fourth semiconductor layers 106 and 110.

Figure 22:
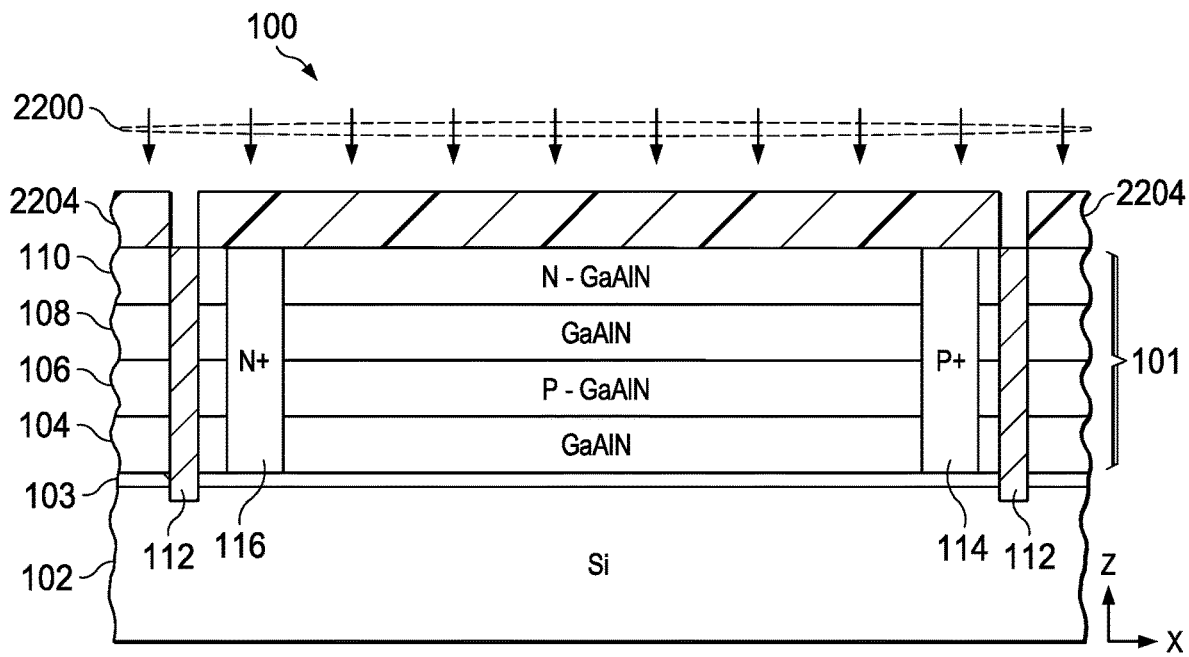

The method 1400 also includes forming an isolation structure (e.g., the isolation structure 112 in FIGS. 1-3) at 1422. FIG. 22 shows one example of the etching at 1422, in which a deep trench isolation process 2200 is performed that etches an isolation trench through the first, second, third, and fourth semiconductor layers 104, 106, 108, and 110, and further through the transition layer 103 and into the substrate 102. The etch processing 2200 in this example uses a patterned etch mask 2204 as shown in FIG. 22. The trenches then filled with electrically isolating material 112, which can include deposition of the sidewall material and trench filling with suitable material, such as doped polysilicon 112. In another example, shallow trench isolation (STI) processing can be used. One example deep trench isolation process includes depositing one or more dielectric liners (not shown) on sidewalls of the etched trench, for example, through the openings in the etch mask 2204 of FIG. 22. The dielectric liner can be a single layer or a multilayer structure. In one example, the dielectric liner is formed at 1422 as an oxide-nitride-oxide (ONO) dielectric liner in the etched trench. After the sidewall liner is formed, the deep trench processing 1422 in one example includes depositing polysilicon to fill the etched trench, for example, through the opening in the mask 2204. In one example, the trench fell polysilicon deposition processing at 1422 deposits p-doped polysilicon with p-type majority carrier dopants (e.g., boron) to fill the isolation trench. The deep trench processing at 1422 can also include a back side polysilicon removal or stripping step, such as a wet etch process that strips excess polysilicon from the bottom side of the semiconductor substrate 102, as well as planarizing the top side of the wafer (e.g., using a chemical mechanical polishing (CMP) process). The implant isolation process can also be used for isolating the superlattice photo detectors, such as using a N (nitrogen) implant to increase the resistivity of the implanted N and P type areas.

Figure 23:
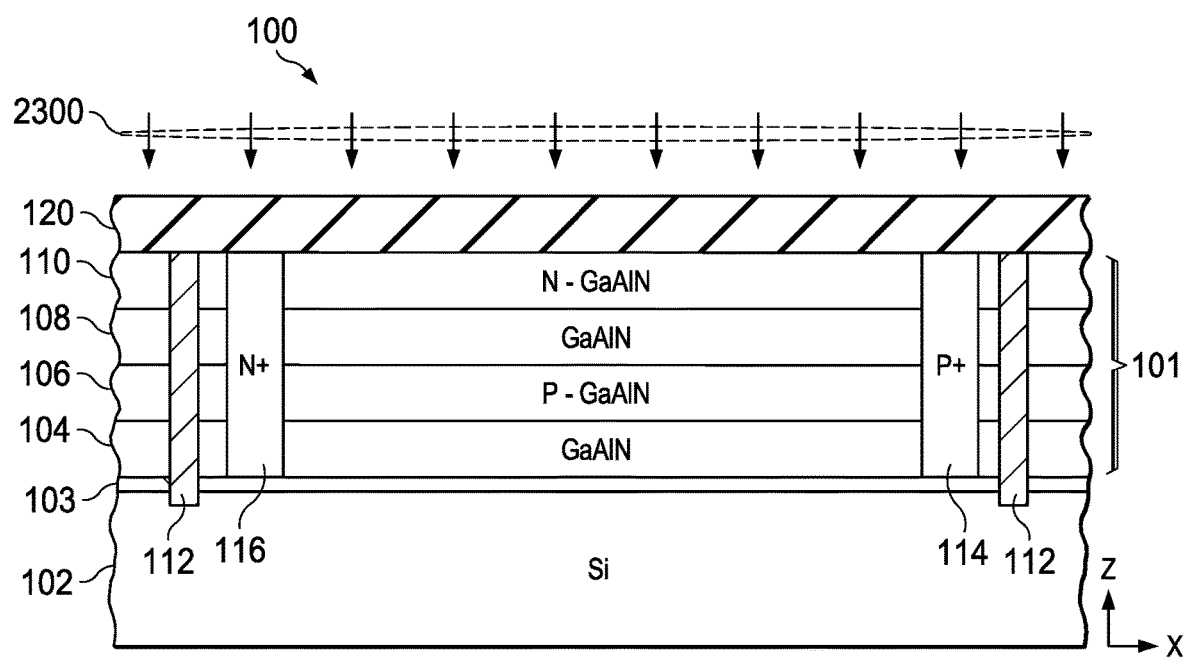

The method 1400 further includes depositing a dielectric material at 1424. FIG. 23 shows an example of a dielectric deposition process 2300 performed at 1424, which deposits dielectric material (e.g., the oxide dielectric 120 in FIGS. 1-4). In one example, the dielectric deposition process 2300 includes high density plasma (HDP) deposition of oxide or nitride and physical vapor deposition (PVD) to form tetraethyl orthosilicate or tetraethoxysilane (TEOS) oxide.

Figure 24:
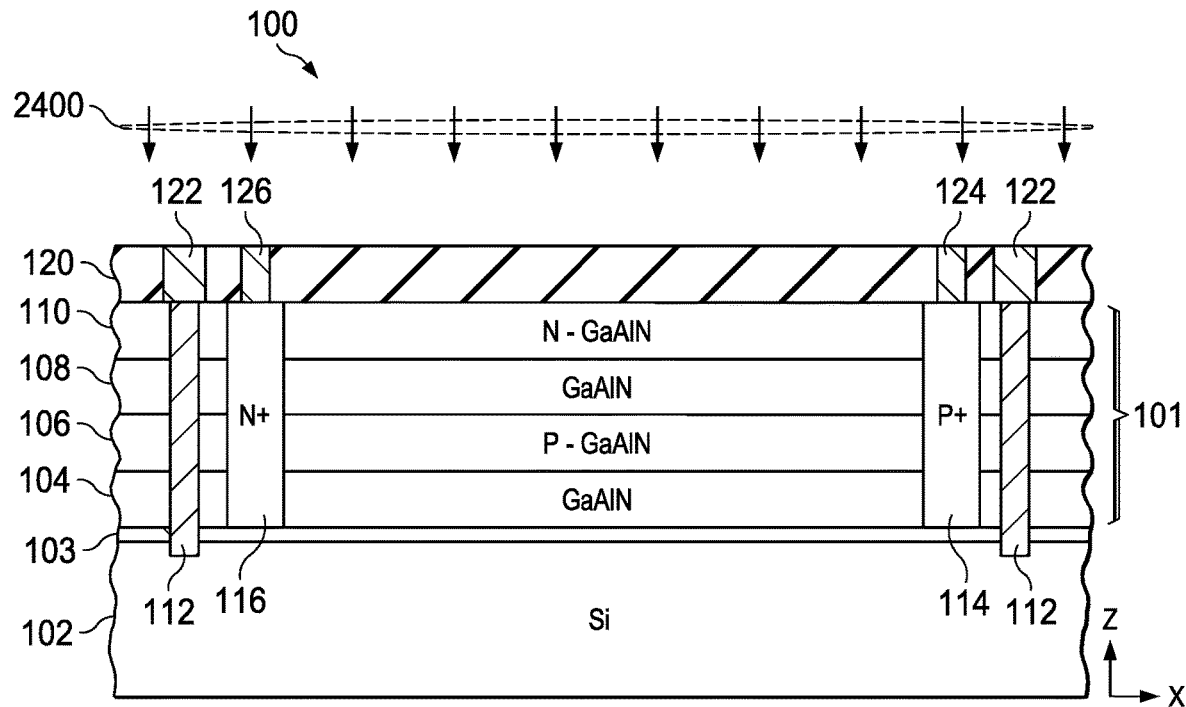

The method 1400 continues at 1426 to form contacts to the superlattice cell contacts. FIG. 24 shows one example, in which a contact formation process 2400 is performed that includes depositing and patterning and etch mask (not shown), etching openings in the dielectric layer 120, and depositing metal (e.g., aluminum or copper) into the etched openings to form the electrically conductive contacts 122, 124, and 126.

Figure 25:
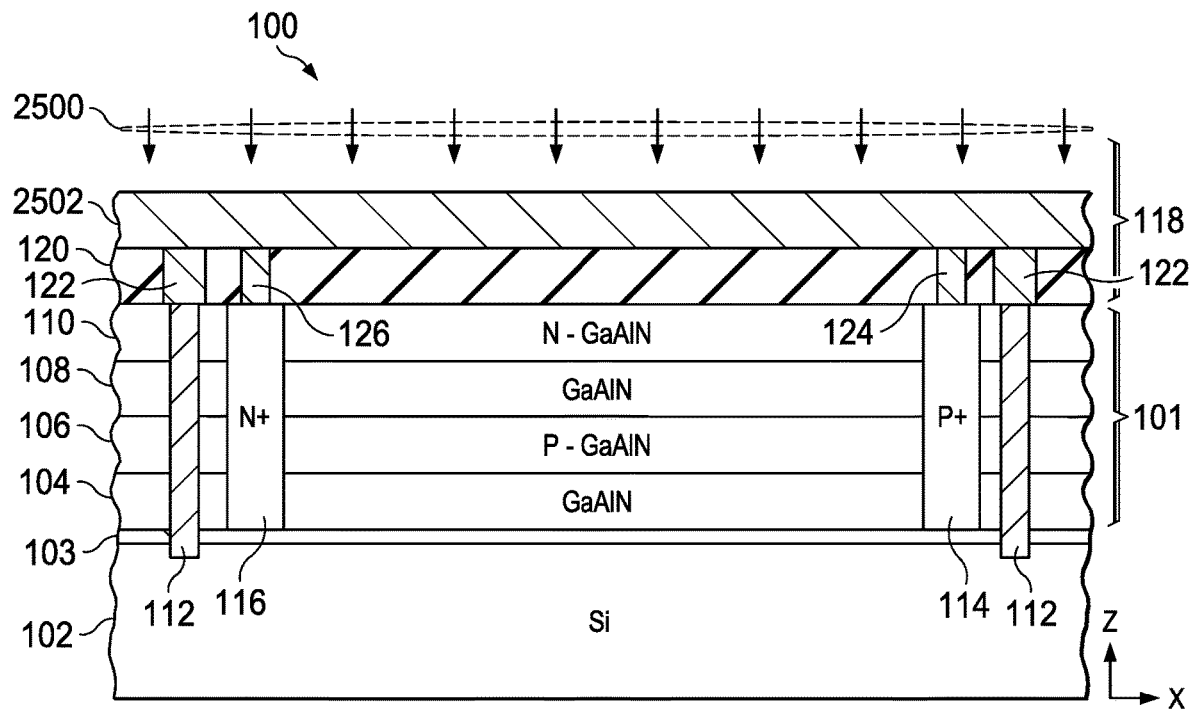
Figure 26:
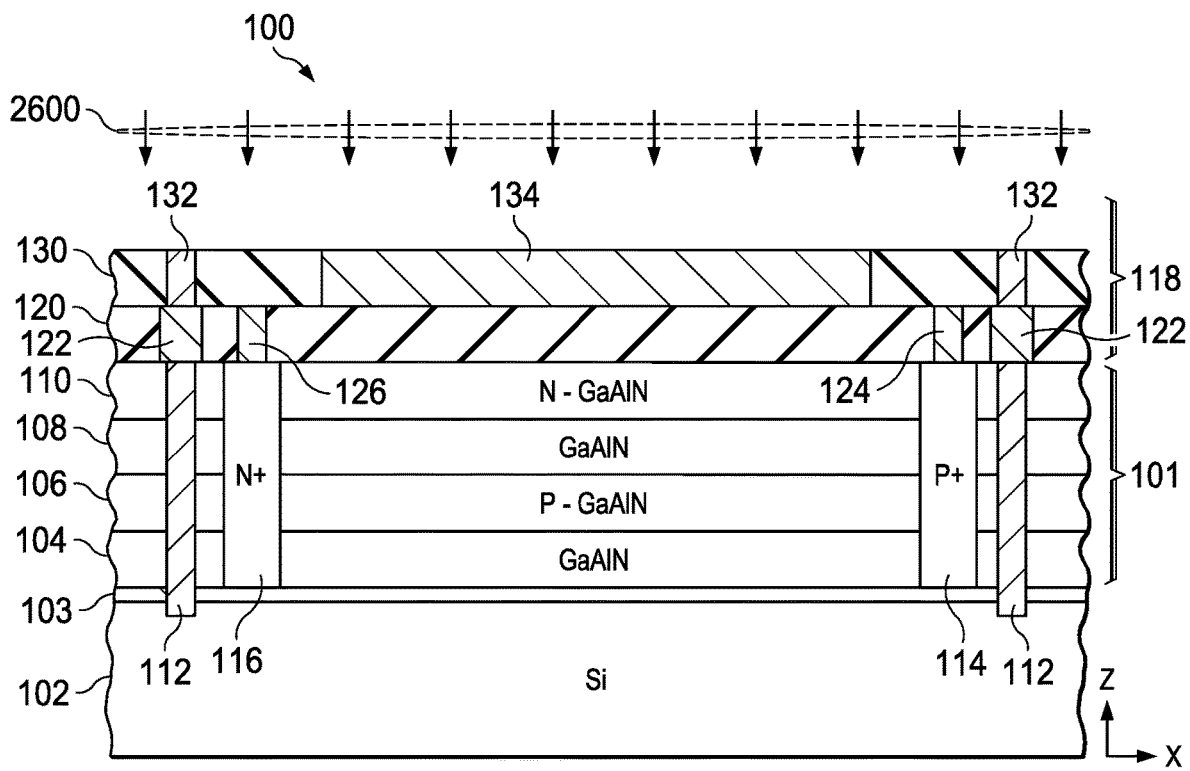

At 1428 and 1430, the method 1400 further includes (e.g., P+ contact 114 and N+ contact 116 in FIGS. 1-4. This example includes depositing a conductive metal material at 1428, such as Ti/Au (titanium/gold) or Ti/Ni (titanium/nickel) for P type GaN, Al/Ti (aluminum/titanium) for N type GaN, copper deposited to a thickness of 1 to 3 µm for silicon, etc. FIG. 25 shows one example, in which a copper deposition process 2500 is performed that deposits a copper layer 2502. At 1430, the deposited metal is patterned and etched to form the optical shield 134. FIG. 26 shows one example, in which a process 2600 is performed that etches the copper material 2502 to form the conductive metal 134 of the optical shield. In this example, an optical shielding layer is provided by the portions of the dielectric layer 120 and the metal shield structure 134. As further shown in FIG. 26, a pre-metal dielectric (PMD) 130 and contacts 132 are formed in the PMD layer 130 via the processing 2600.

The method 1400 continues at 1432 with further metallization and passivation. In one example, further metallization levels can be added, leaving an opening for the first portion of the surface 111 to receive light, and the upper side can be passivated with a SiN layer deposition (not shown). The method 1400 also includes die singulation or dicing at 1434 to separate individual dies from a starting wafer. FIGS. 1-4 show partial views that represent a singulated die having a photo detector 100.

Figure 27:
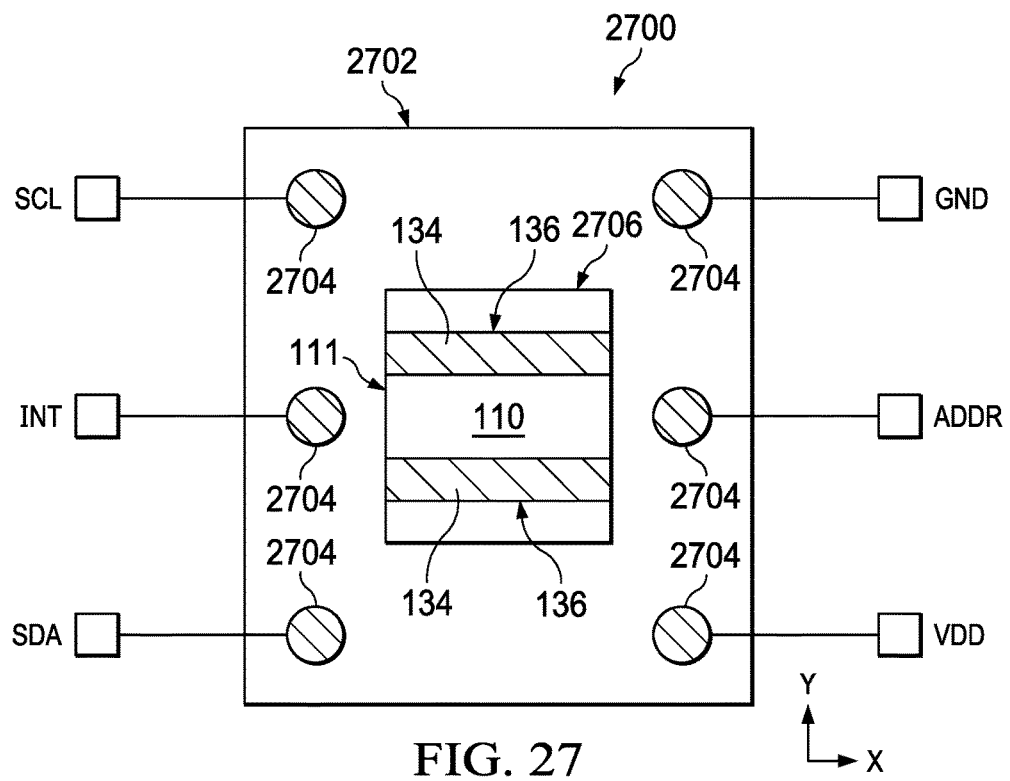
FIG. 27 is a top plan view of a package electronic device including a photo detector.

The method 1400 further includes forming a packaging structure at 1436, such as by molding. FIG. 27 shows a top plan view of a packaged electronic device 2700 (e.g., chip) including a single photo detector partially enclosed by a molded package structure 2702 with solderable pads or other conductive features 2704. The packaged electronic device 2700 has an opening 2706 that extends through the molded package structure 2702 to allow light to enter the first portion of the surface 111 of the fourth semiconductor layer 110. The opening 2706 in this example also exposes the top sides 136 of two example optical shields 134, although not a requirement of all possible implementations. The packaging processing at 1436 in one example also includes formation of the pads 2704 on the top side of the device 2700. The example device 2700 includes sensor circuitry to bias the superlattice cell 101, an analog to digital converter (ADC) to convert analog sense signals into digital values, and a communications interface to allow a host circuit (not shown) to read digital data from the packaged device 2700. The packaged photo detector device 2700 in FIG. 27 includes a first pad connected to a serial clock signal line (SCL), a second pad connected to an interrupt signal line (INT), a third pad connected to a serial data line (SDA), a fourth pad connected to a DC power line (VDD), a fifth pad connected to an address signal line (ADDR), and a sixth pad connected to a ground line (GND).

Figure 28:
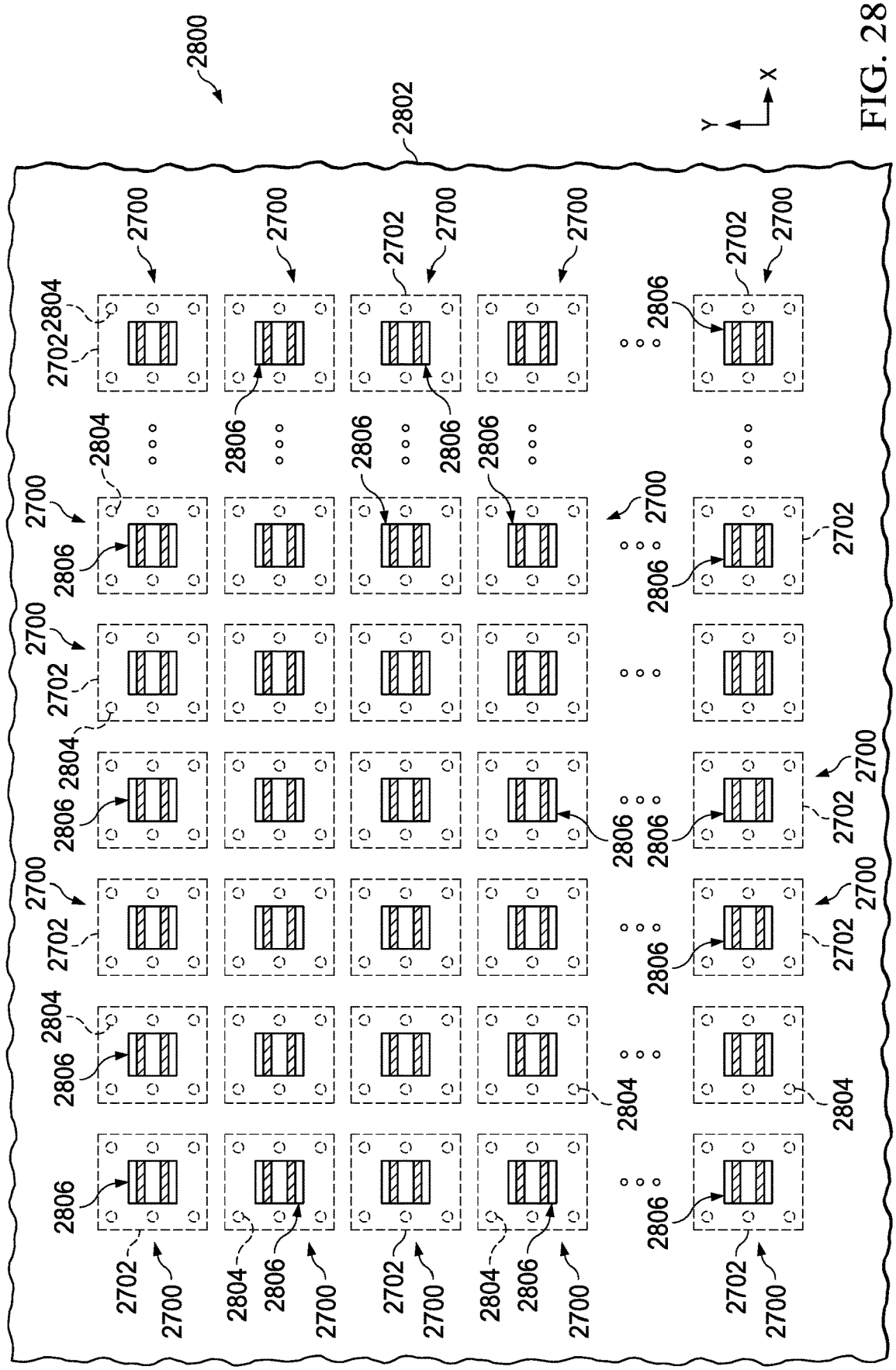
FIG. 28 is a partial top plan view of a photo detector system with an array of packaged photo detector devices mounted to a printed circuit board.

FIG. 28 shows a partial top view of a photo detector system 2800. The system 2800 includes an array of the example packaged single photo detector devices 2700 of FIG. 27 mounted to a substrate 2802, such as a printed circuit board, to form a high sensitivity and high gain 3D MWSPDA. The pads 2704 of the top sides of the individual packaged devices 2700 are soldered to corresponding circuit board pads 2804 of the circuit board 2802 (shown in dashed lines in FIG. 28). The circuit board 2802 in FIG. 28 also includes openings 2806 with which the openings 2706 of the corresponding package devices 2700 are aligned in the X-Y plane. This allows light to be sensed at the surface 111 of the superlattice cell 101 through the circuit board opening 2806 and the packaged device opening 2706. The configuration in FIG. 28 provides a two-dimensional array of packaged photo detector devices 2700. The photo detector array in this example includes an array of the circuit board apertures 2806 and an array of superlattices 101 within the individual packaged photo detector devices 2700. The superlattices 101 in this example are in respective chips 2700 soldered to the substrate 2802. The individual chips each include including an undoped (e.g., intrinsic) first semiconductor layer 104, a doped second semiconductor layer 106, and undoped third semiconductor layer 108, an oppositely doped fourth semiconductor layer 110, and an optical shield formed by the dielectric 120 and the metallic shield 134 as described above in connection with FIGS. 1-4.

Figure 29:
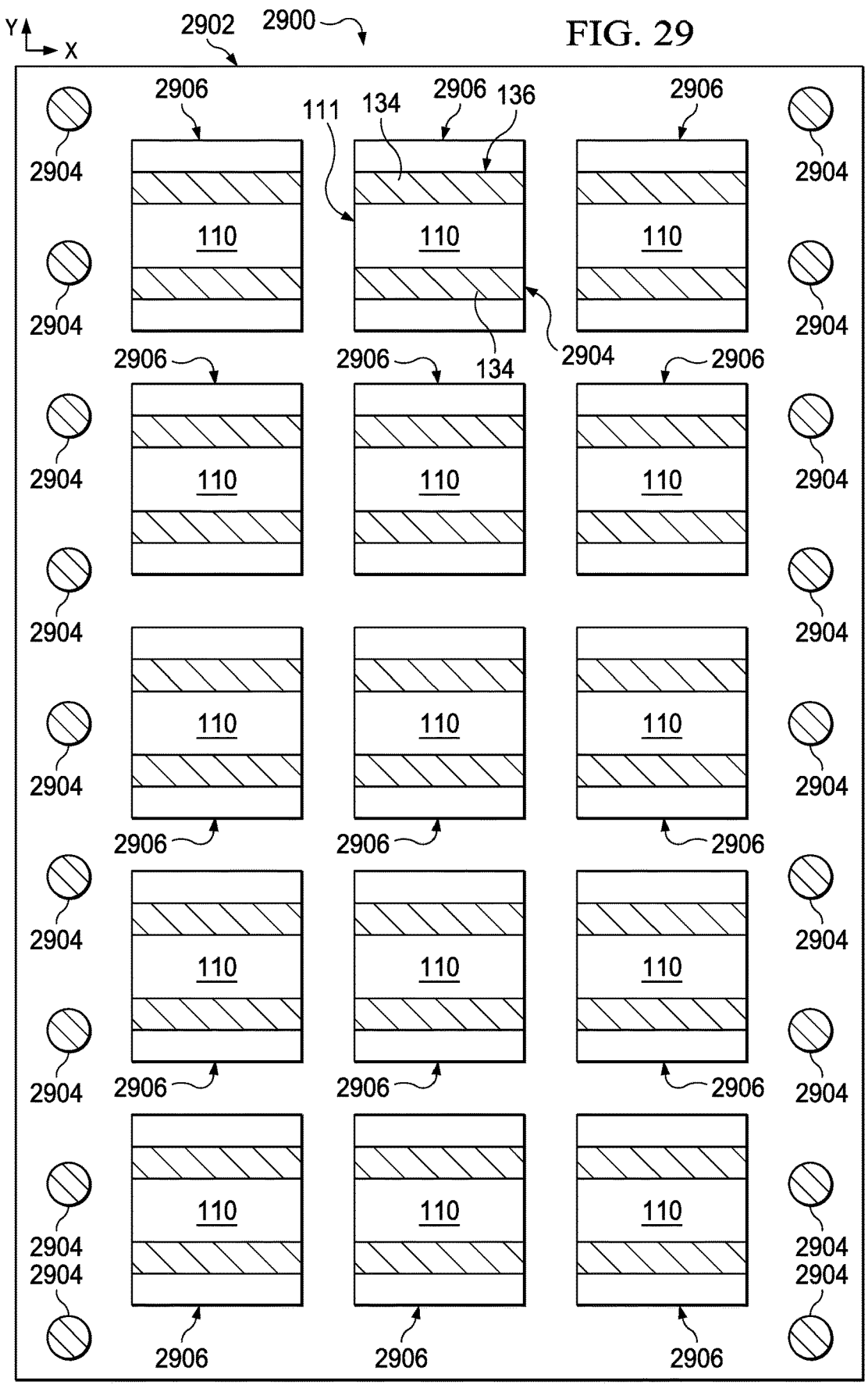
FIG. 29 is a top plan view of a packaged electronic device including an array of photo detectors.

FIG. 29 shows a top view of another packaged electronic device 2900 that includes an array of photo detectors in a single-chip implementation. The individual photo detectors in this example are formed in different isolated regions of a single singulated chip that is molded or otherwise packaged in a package structure 2902 with conductive pads 2904. The packaged electronic device 2900 also includes openings 2906 aligned with the individual photo detector regions to allow entry of light into the first portion of the surface 111 of the corresponding fourth semiconductor layer 110. The device 2900 in FIG. 29 provides a single chip 3D MWSPDA that can be soldered to a host printed circuit board or other substrate (not shown) having corresponding openings for the individual photo detector cells.

Figure 30:
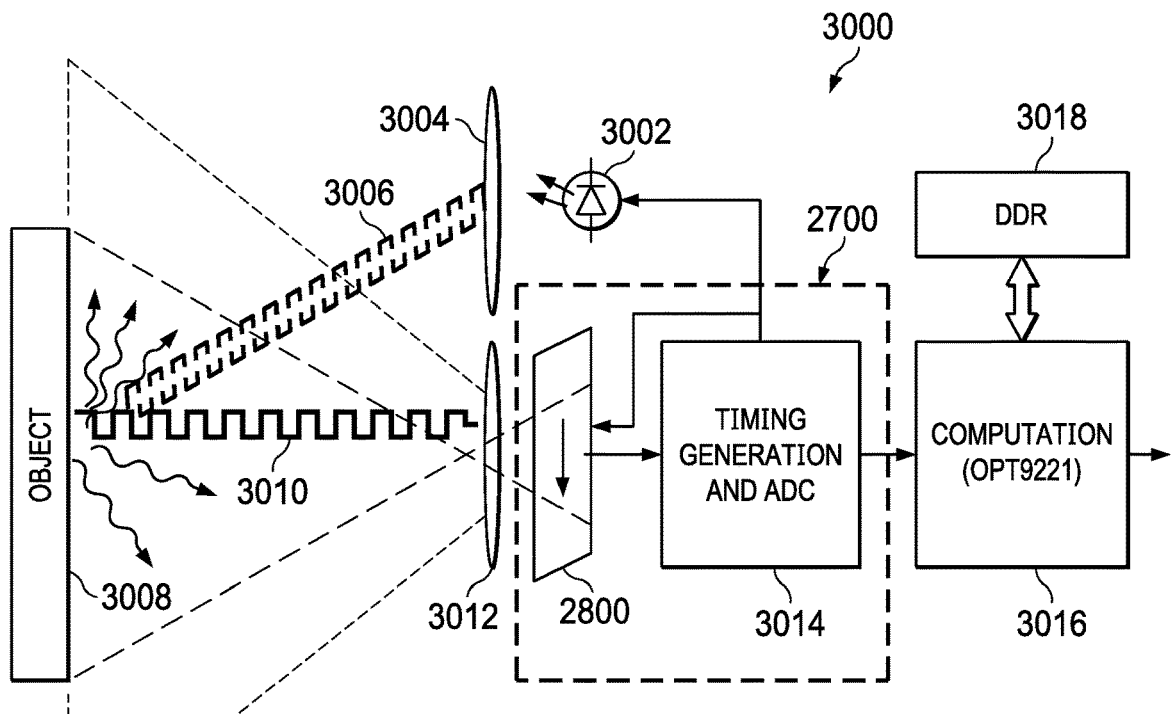
FIG. 30 is a schematic diagram of a three dimensional time of flight (ToF) camera system.

FIG. 30 shows a schematic diagram 3000 of a three dimensional time of flight (ToF) camera system that includes the example photo detector system 2800 described above in connection with FIG. 28. The system 300,000 includes a light source 3002, such as one or more light emitting diodes (LEDs) configured to emit light through a transmission lens 3004. The light 3006 exiting the lens 3004 is reflected off and object 3008, and reflected light 3010 is received through a reception lens 3012. The light received through the reception lens 3012 is received by the photo detector system 2800. The photo detector system 2800 provides analog signals to a timing generation and analog to digital converter (ADC) circuit 3014 on the circuit board 2700. The timing generation and ADC circuit 3014 provides digital measurement values to a computation circuit 3016, and computed values from the computation circuit 3016 can be stored in a DDR memory 3018.

Figure 31:
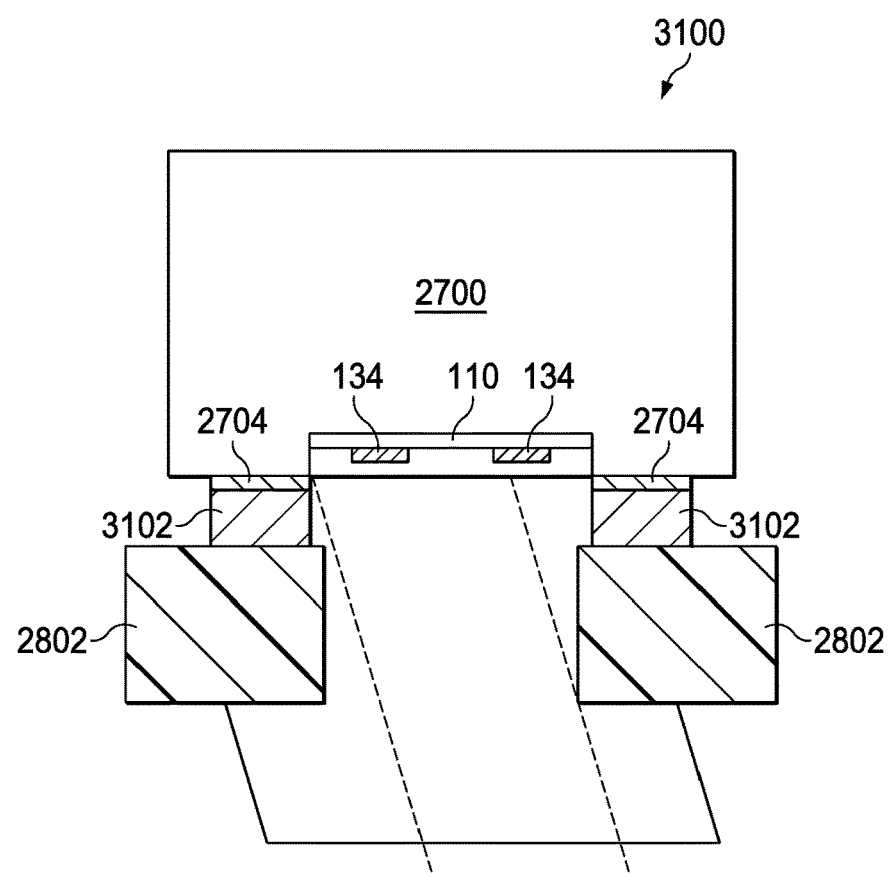
FIG. 31 is a partial side elevation view of a lux meter including a single-chip photo detector mounted to a printed circuit board.

FIG. 31 shows a partial side elevation view of a lux meter 3100 including a single-chip photo detector 2700 mounted to a printed circuit board 2802. In this example, the conductive pads 2704 of the packaged photo detector 2700 are soldered to corresponding pads of the printed circuit board 2802 using solder 3102. The opening through the printed circuit board 2802 law allows light to enter the opening of the photo detector 2700, some of which is blocked or obscured by the optical shields 134.

Figure 32:
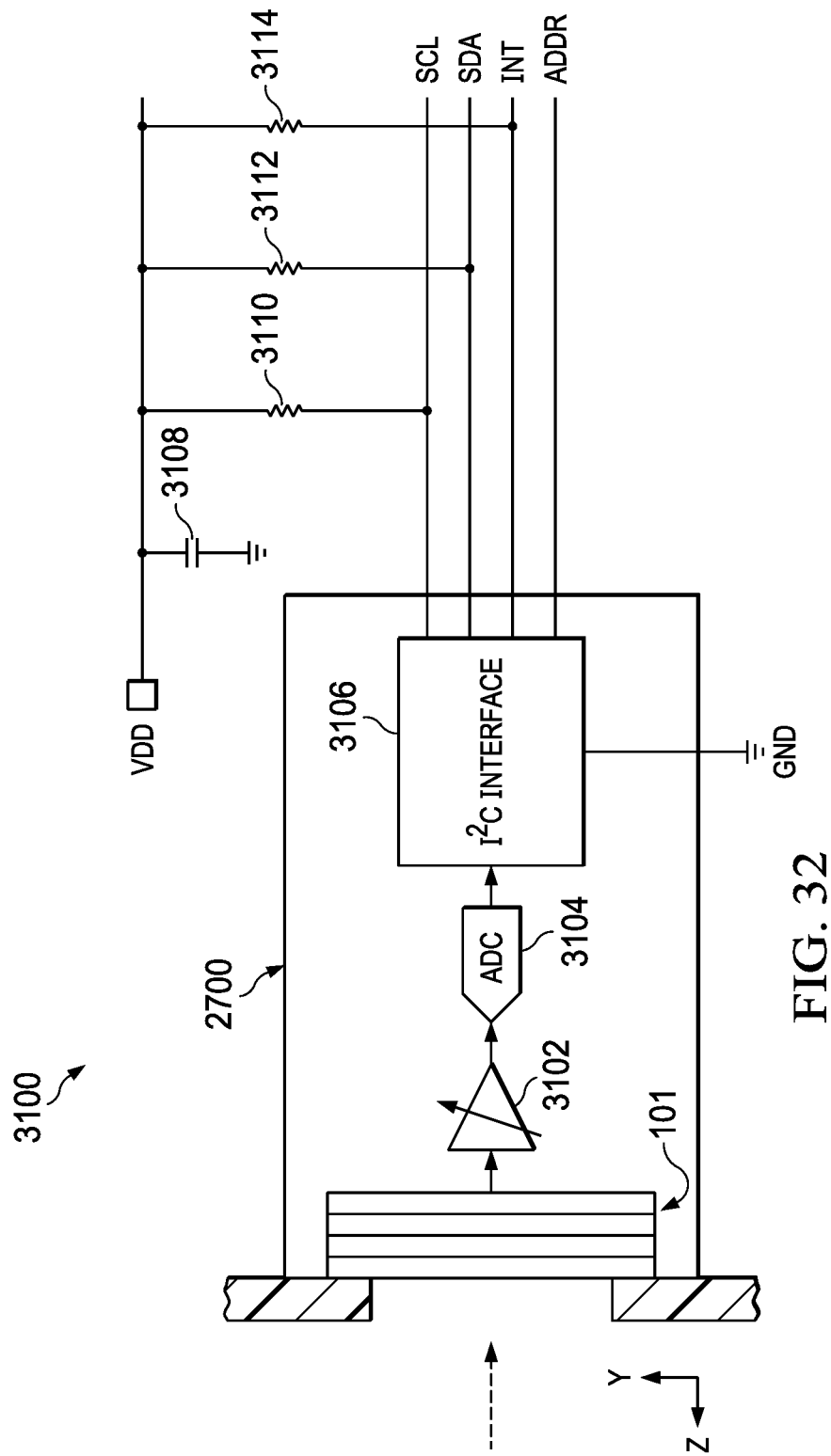
FIG. 32 is a schematic diagram of the single-ship lux meter of FIG. 31.

FIG. 32 shows a schematic diagram of the single-ship lux meter 3100 of FIG. 31. In this example, the superlattice 101 provides a signal to an adjustable gain amplifier 3102 on the circuit board 2700. The amplifier 3102 provides an analog input signal to an analog-to-digital converter (ADC) 3104. The ADC 3104 provides converted digital values to a communications interface circuit 3106 (e.g., an I²C interface), which provides the serial clock (SCL), serial data (SDA), interrupt (INT), and address (ADDR) interface connections to a host system (not shown). The example lux meter 3100 in this case also includes a decoupling capacitor 3108 connected between a DC voltage supply signal connection VDD and a ground connection, as well as pull up resistors 3110, 3112 and 3114 connected to the serial clock, serial data, and interrupt signal lines, respectively.

Figure 33:
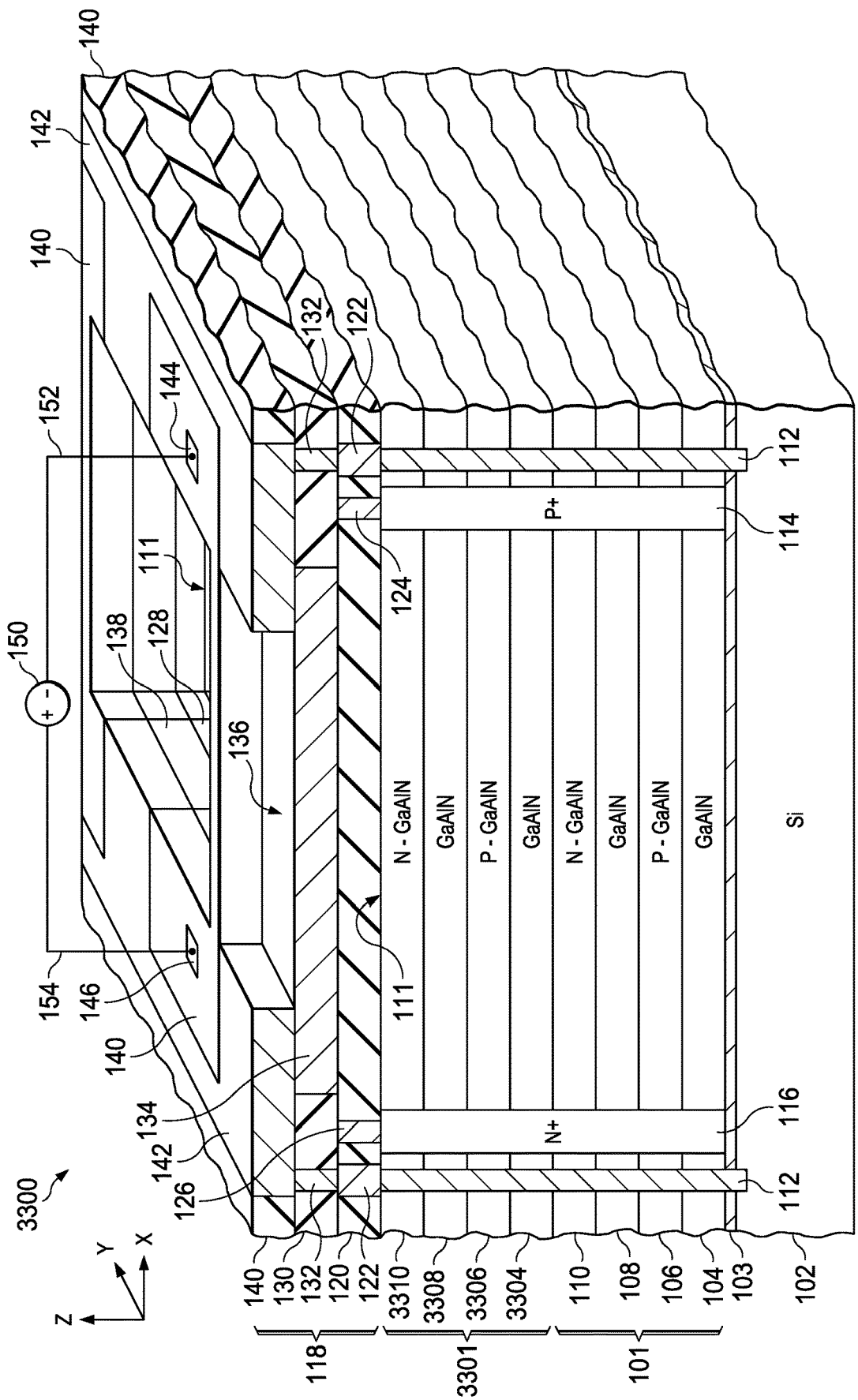
FIG. 33 is a partial sectional perspective view a multilayer superlattice photo detector with multiple superlattice cells.

FIG. 33 shows a partial sectional perspective view an example multilayer superlattice photo detector 3300 with multiple stack superlattice cells. In one example, a completed photo detector device also includes address lines, data read lines, device control lines, etc. (not shown in FIG. 33). In this example, a first superlattice cell 101 includes the first, second, third, and fourth semiconductor layers 104, 106, 108, and 110, respectively, as described above in connection with FIGS. 1-4. This example includes a second superlattice cell 3301. The second cell 3301 is stacked on the first cell 101, and a first portion of the upper or top surface 111 of the upper superlattice cell 3301 is configured to receive light through an opening in the top side of the photo detector 3300. In one example, the first cell 101 and the second cell 3301 include semiconductor layer stacks of different energy band gaps. This provides improved sensitivity to cover a wider wavelength range. In one example, multi-cell stacked configurations provide multilayer hetero superlattice structures with different energy bandgap. In the example of FIG. 33, the second superlattice cell 3301 is an N-I-P-I structure with a fifth semiconductor layer 3304 on the fourth semiconductor layer 110. The fifth semiconductor layer 3304 includes undoped intrinsic semiconductor material. The second superlattice cell 3301 also includes a p-type sixth semiconductor layer 3306 on the fifth semiconductor layer 3304, a seventh semiconductor layer 3308 with undoped intrinsic semiconductor material on the sixth semiconductor layer 3306, and an n-type eighth semiconductor layer 3310 on the seventh semiconductor layer 3308. The second superlattice 3301 in this example has a different energy bandgap than the first superlattice 101.

Figure 34:
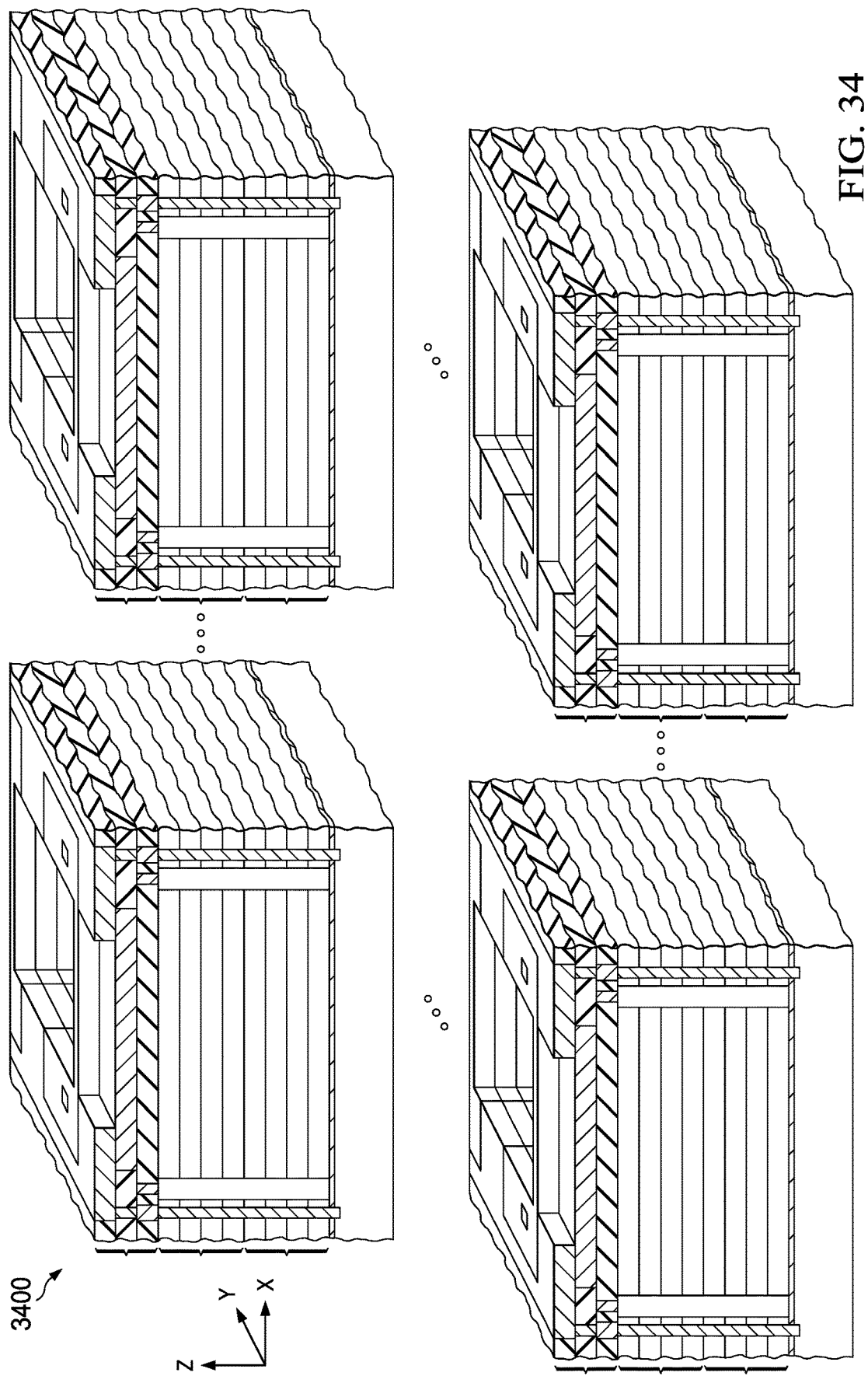
FIG. 34 is a partial sectional perspective view of another single chip three-dimensional multi-wavelength superlattice photo detector array with multiple photo detectors configured in an array.

FIG. 34 shows a partial sectional perspective view of another single chip three-dimensional multi-wavelength superlattice photo detector array 3400 with multiple photo detectors configured in an array within a single-chip or die. In this example, moreover, each photo detector is positioned within a laterally surrounding isolation structure 112 in the die, and each photo detector includes a stacked configuration with a first N-I-P-I superlattice 101 under a second N-I-P-I superlattice 3301 as described above in connection with FIG. 33.

Figure 35:
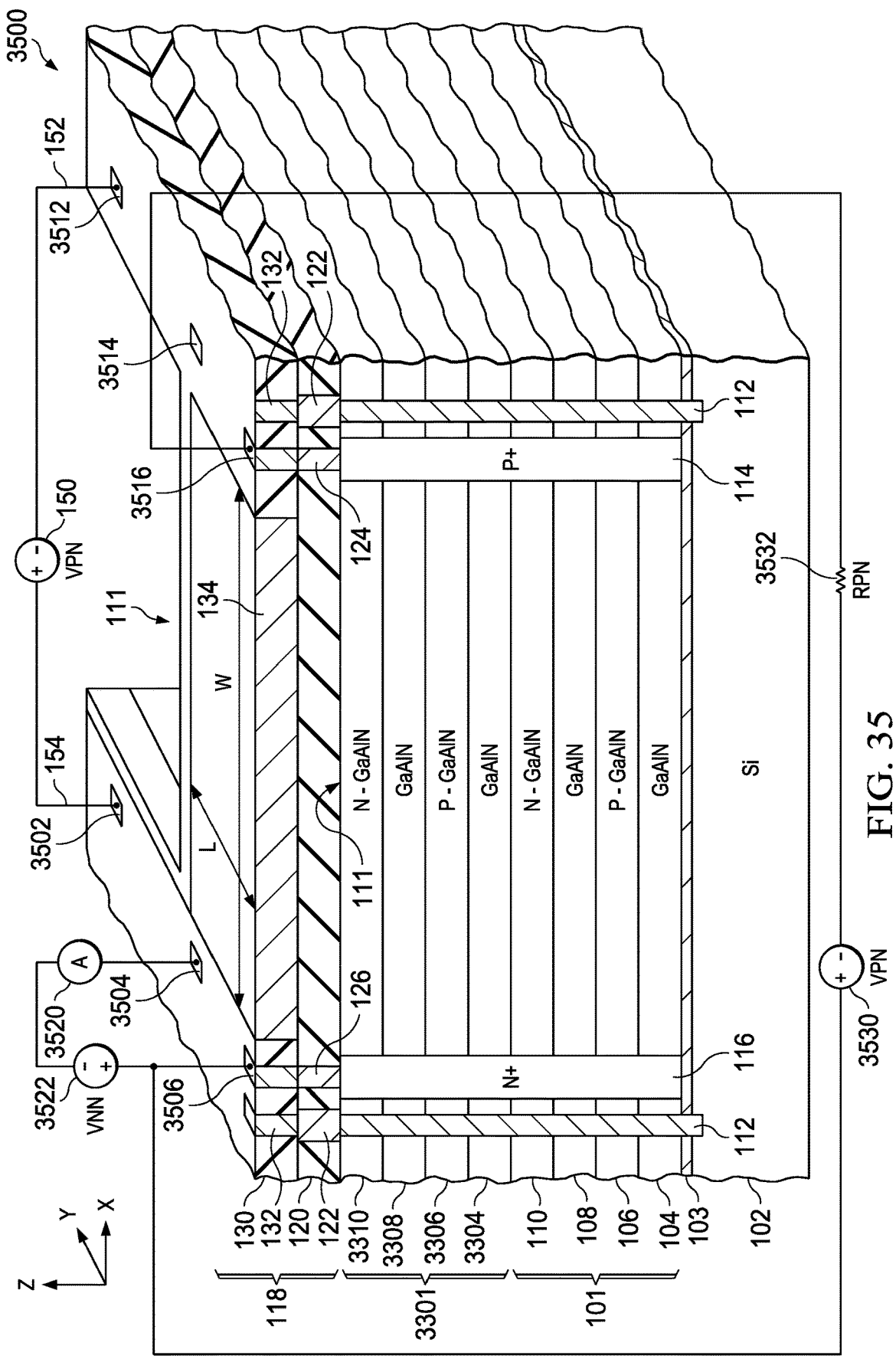
FIG. 35 is a partial sectional perspective view a multilayer superlattice photo detector optical memory cell with multiple superlattice cells.

FIG. 35 shows a portion of an electronic device 3500 with a multilayer superlattice photo detector optical memory cell with multiple superlattice cells, shown without the upper ILD layer 140 of the metallization structure 118 to show connections and contacts for operation as a memory cell. The conductive optical shield 134 has a length L and a with W as shown in FIG. 35, which control the spatially separated hole lake and electron lake under the blocking areas. The optical shield area Aos of the optical shield 134 is given as Aos=L×W. The optical gain of this example detector is proportional to the size of the electron lake and hole lake. The volume of the electron lake as well as the hole lake depend on the width of the depletion region which is controlled by the bias voltage VPN with the following approximated equation: V (EL)=L×W×dn (effective)×2 (e.g., the number of dn layers), where the dn (effective)=dn (e.g., the thickness of the superlattice n-layer)–width of depletion region (VPN). Increasing of the reverse bias voltage VPN increases the depletion region, decreases the effective dn, and decreases the size (the volume) of the electron lake. The same relationships apply for the hole lake. For one example 3D MWSPDA device 3500 with a n-i-p-i-n-i-p-i structure 101, 3301 as described above, with an n-superlattice layer thickness dn=50 nm=0.05 μm and a p-superlattice layer thickness dp=50 nm=0.05 μm, a length L=6 μm, and a width W=10 μm, the maximum volume VEL of the electron lake under the optical shielding area could be expressed as VEL=L×W×dn×2 (e.g., where the number of dn layers=2)=6 μm×10 μm×0.05 μm×2=6 μm³.

FIG. 35 also schematically shows interconnection for a photo detector with optical shielding structure 134, operating as a memory cell. In this example, the device is an optical ram with optical write & electrical read. The memory cell provides optical write functions through the optical absorption area, with optical storage under the optical shielding area. The device 3500 provides electrical reading through external circuits of a VNN loop and a VPN loop, respectively. The photo detector device 3500 includes conductive features 3502, 3504, and 3506 (e.g., copper or aluminum contacts) formed in the dielectric layer 130 that are electrically connected to the N+ second contact 116, as well as conductive features 3512, 3514, and 3516 (e.g., copper or aluminum contacts) formed in the dielectric layer 130 that are electrically connected to the P+ first contact 114. In one example, the conductive features 3502, 3504, 3506, 3512, 3514, and 3516 extend through the dielectric layer 130 and are connected to externally exposed contacts (not shown) that extend through the ILD layer 140 shown in FIGS. 33 and 34) to provide solderable interconnections to a host PCB (not shown).

The photo detector device 3500 in one example includes a memory interface circuit configured to read the photo detector. The schematic memory interface circuit connections shown in FIG. 35 in one example are made in a single packaged electronic device 3500. In another example, the schematic memory interface circuit connections shown in FIG. 35 in one example are made in a host PCB (not shown). Other implementations are possible, in which one or more of the circuit elements are in the packaged electronic device and one or more other circuit elements are on or in the host PCB. A first circuit includes the bias voltage source 150 with the circuit connection 154 to the N+ contact 3502, and the circuit connection 152 to the P+ contact 3512 to apply a reverse bias voltage VPN as described above. The circuitry also includes a current source 3520 connected between the N+ contact 3504 and a negative terminal of a voltage source 3522. The voltage source 3522 has a positive terminal connected to the N+ contact 3506. The P+ contacts 3504 and 3506 are spaced from one another along the Y direction near the longitudinal ends within the length extent of the optical shield 134. The P+ contacts 3514 and 3516 are spaced from one another along the Y direction near the longitudinal ends within the length extent of the optical shield 134. The memory interface circuitry also includes a voltage source 3530 (VPN) connected in series with a resistor 3532 (RPN) between the P+ connection 3516 and the N+ contact 3506. The memory cell device 3500 provides optical write functions through the optical absorption area, with optical storage under the optical shield 134. The device 3500 provides electrical reading through external circuits of a VNN loop and a VPN loop, respectively.

Described examples provide enhanced sensitivity and gain which can be employed in a variety of end-use applications, for example, to meet requirements from industry applications, such as for artificial intelligence, autonomous vehicle applications, medical instruments, etc. Described examples facilitate photo detection systems with high sensitivity and fast response across a wide optical spectrum range, for optical sensing, optical memory device applications and optical amplifiers. The N-I-P-I superlattice structures 101, 3301 facilitate formation of two-dimensional tunable electron and hole tanks or lakes with a long recombination lifetime under the optical shield 134 using the properties of the spatial separation between electrons and holes, and provide sensitivity and gain advantages over conventional photo detectors that have no carrier separation. The example optical shielding structures and techniques, in combination with applied electrical fields in the X and Y directions form a three dimensional superlattice detector array in certain examples. The use of multiple stacked superlattice cells, moreover, provides the ability to enhance the wavelength range of a given photo detector design.

The above examples are merely illustrative of several possible implementations of various aspects of the present disclosure, wherein equivalent alterations and/or modifications will occur to others skilled in the art upon reading and understanding this specification and the annexed drawings. Modifications are possible in the described examples, and other implementations are possible, within the scope of the claims.

What is claimed is:

1. A method of fabricating a photo detector, the method comprising:
    forming a superlattice on a transition layer over a substrate, including:
        forming an undoped first semiconductor layer,
        forming a doped second semiconductor layer having a first conductivity type on the first semiconductor layer,
        forming an undoped third semiconductor layer on the second semiconductor layer, and
        forming a fourth semiconductor layer having a second opposite conductivity type on the third semiconductor layer;
    implanting an n-type dopant of the first conductivity type into a first implanted region of the superlattice, thereby forming an n-type contact that extends from a top surface of the superlattice through the first, second, third, and fourth semiconductor layers; and
    implanting a p-type dopant of the second conductivity type into a second implanted region of the superlattice, thereby forming a p-type contact that extends from a top surface of the superlattice through the first, second, third, and fourth semiconductor layers, the first implanted region being spaced apart from the second implanted region,
    wherein the n-type contact and the p-type contact touch the transition layer.

2. The method of claim 1, further comprising:
    forming an optical shield on a top surface of the fourth semiconductor layer; and
    forming a window in the optical shield over a portion of the fourth semiconductor layer.

3. The method of claim 2, further comprising mounting the superlattice on a packaging structure that includes an opening that allows light to enter the window in the optical shield.

4. A method of forming a photo detector, comprising:
    forming a first semiconductor layer, the first semiconductor layer including undoped intrinsic semiconductor material,
    forming a second semiconductor layer on the first semiconductor layer, the second semiconductor layer having a first conductivity type,
    forming a third semiconductor layer on the second semiconductor layer, the third semiconductor layer including undoped intrinsic semiconductor material, and
    forming a fourth semiconductor layer on the third semiconductor layer, the fourth semiconductor layer having a second opposite conductivity type;
    forming a first contact extending through the first, second, third, and fourth semiconductor layers, the first contact having the first conductivity type;
    forming a second contact extending through the first, second, third, and fourth semiconductor layers, the second contact spaced apart from the first contact, and having the second conductivity type; and
    forming a transition layer between the first semiconductor layer and a substrate, wherein the transition layer has a different chemical composition than the substrate, and the first and second contacts land on the transition layer.

5. The method of claim 4, wherein
    forming the first contact includes implanting an n-type dopant into the first, second, third, and fourth semiconductor layers at a first location; and
    forming the second contact includes implanting a p-type dopant into the first, second, third, and fourth semiconductor layers at a second location laterally spaced apart from the first location.

6. The method of claim 5, wherein:
    the first contact has a higher carrier concentration than the second and fourth semiconductor layers; and
    the second contact has a higher carrier concentration than the second and fourth semiconductor layers.

7. The method of claim 4 further comprising forming an isolation structure surrounding a portion of the first, second, third and fourth semiconductor layers.

8. The method of claim 4, further comprising forming an optical shield configured to at least partially attenuate light received by a first portion of the fourth semiconductor layer, and including an opening through which light can pass unattenuated to a second portion of the fourth semiconductor layer.

9. The method of claim 8, wherein the optical shield includes a dielectric layer and a metal layer over the dielectric layer.

10. The method of claim 9,
wherein the first semiconductor layer is located between a substrate and the second semiconductor layer; and
wherein the fourth semiconductor layer contacts the dielectric layer.

11. The method of claim 4, further comprising:
forming a fifth semiconductor layer on the fourth semiconductor layer, the fifth semiconductor layer including intrinsic semiconductor material;
forming a sixth semiconductor layer on the fifth semiconductor layer, the sixth semiconductor layer having the first conductivity type;
forming a seventh semiconductor layer on the sixth semiconductor layer, the seventh semiconductor layer including intrinsic semiconductor material; and
forming an eighth semiconductor layer on the seventh semiconductor layer, the eighth semiconductor layer having the second conductivity type.

12. The method of claim 11, wherein a first superlattice comprising the first, second, third and fourth semiconductor layers has a different energy bandgap than a second superlattice comprising the fifth, sixth, seventh and eighth semiconductor layers.

13. The method of claim 11, further comprising forming an optical shield over the eighth semiconductor layer, the optical shield including a shielding portion over a first portion of the eighth semiconductor layer and an aperture over a second portion of the eighth semiconductor layer.

14. The method of claim 13, wherein a first superlattice includes the first, second, third and fourth semiconductor layers and a second superlattice includes the fifth, sixth, seventh and eighth semiconductor layers, and the optical shield facilitates formation in the presence of light a two-dimensional electron lake in at least one of the first superlattice and the second superlattice under the shielding portion and a two-dimensional hole lake spaced apart from the two-dimensional electron lake in the at least one of the first superlattice and the second superlattice under the shielding portion.

15. The method of claim 14, further comprising configuring a voltage source to apply a bias voltage signal to the first superlattice and to the second superlattice to control a size of the two-dimensional electron lake, and a size of the two-dimensional hole lake.

16. The method of claim 4, further comprising configuring a memory interface circuit to determine an information storage state of the photo detector.

17. The method of claim 4, further comprising forming:
a fifth semiconductor layer on the fourth semiconductor layer, the fifth semiconductor layer including undoped intrinsic semiconductor material,
a sixth semiconductor layer on the fifth semiconductor layer, the sixth semiconductor layer having the first conductivity type,
a seventh semiconductor layer on the sixth semiconductor layer, the seventh semiconductor layer including undoped intrinsic semiconductor material, and
an eighth semiconductor layer on the seventh semiconductor layer, the eighth semiconductor layer having the second conductivity type,
wherein the first and second contacts each extend through the first, second, third, fourth, fifth, sixth, seventh and eighth semiconductor layers.

18. A method of forming a photo detector array, comprising:
attaching a plurality of photo detectors to a substrate having an array of apertures formed therethrough, each photo detector having a window in an optical shield, the window aligned with a corresponding one of the apertures, the window exposing a superlattice including:
an undoped first semiconductor layer,
a doped second semiconductor layer having a first conductivity type over and touching the first semiconductor layer,
an undoped third semiconductor layer over and touching the second semiconductor layer, and
a fourth semiconductor layer having a second opposite conductivity type over and touching the third semiconductor layer.

19. A method of forming a photo detector, comprising:
forming a first superlattice including:
an first intrinsic layer of semiconductor material;
a first doped semiconductor layer having a first conductivity type on the first intrinsic layer;
a second intrinsic layer of semiconductor material on the first doped semiconductor layer; and
a second doped semiconductor layer having a second conductivity type on the second intrinsic layer;
forming a second superlattice including:
a third intrinsic layer of semiconductor material over the second doped semiconductor layer;
a third doped semiconductor layer having the first conductivity type on the third intrinsic layer;
a fourth intrinsic layer of semiconductor material on the third doped semiconductor layer; and
a fourth doped semiconductor layer having the second conductivity type on the fourth intrinsic layer,
wherein the first superlattice has a different energy bandgap than the second superlattice.

20. A method of forming a photo detector, comprising:
forming a first superlattice including:
an first intrinsic layer of semiconductor material;
a first doped semiconductor layer on the first intrinsic layer;
a second intrinsic layer of semiconductor material on the first doped semiconductor layer; and
a second doped semiconductor layer on the second intrinsic layer,
wherein the first doped semiconductor layer is p-type and the second doped semiconductor layer is n-type, or the first doped semiconductor layer is n-type and the second doped semiconductor layer is p-type;
forming a second superlattice including:
a third intrinsic layer of semiconductor material over the second doped semiconductor layer;
a third doped semiconductor layer on the third intrinsic layer;
a fourth intrinsic layer of semiconductor material on the third doped semiconductor layer; and
a fourth doped semiconductor layer on the fourth intrinsic layer,
wherein the third doped semiconductor layer is p-type and the fourth doped semiconductor layer is n-type, or the third doped semiconductor layer is n-type and the fourth doped semiconductor layer is p-type, and
wherein the first superlattice has a different energy bandgap than the second superlattice.

21. A method of fabricating a photo detector, the method comprising:

forming a superlattice on a transition layer over a substrate, the superlattice including a first doped semiconductor layer between first and second intrinsic semiconductor layers, the second intrinsic semiconductor layer being between the first semiconductor layer and a second doped semiconductor layer, wherein the first doped semiconductor layer is p-type and the second doped semiconductor layer is n-type, or the first doped semiconductor layer is n-type and the second doped semiconductor layer is p-type;

implanting n-type dopants into a first region of the superlattice, forming an n-type contact that extends from a top surface of the superlattice to the transition layer; and implanting p-type dopants into a second region of the superlattice, forming an p-type contact that extends from the top surface of the superlattice to the transition layer.

22. The method of claim 21, wherein the first intrinsic semiconductor layer touches the transition layer.

23. The method of claim 21, wherein the second doped semiconductor layer is p-type and touches the transition layer.

24. The method of claim 21, wherein the second doped semiconductor layer is n-type and touches the transition layer.

* * * * *